US012609179B2

(12) United States Patent
Kim et al.

(10) Patent No.: US 12,609,179 B2
(45) Date of Patent: Apr. 21, 2026

(54) METHODS OF TESTING REPAIR CIRCUITS OF MEMORY DEVICES

(71) Applicant: Samsung Electronics Co., Ltd.,
Suwon-si (KR)

(72) Inventors: Taewon Kim, Suwon-si (KR); Sanghee Kang, Suwon-si (KR); Kiho Hyun, Suwon-si (KR); Taeyun Kim, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 124 days.

(21) Appl. No.: 18/515,681

(22) Filed: Nov. 21, 2023

(65) Prior Publication Data

US 2024/0290414 A1     Aug. 29, 2024

(30) Foreign Application Priority Data

Feb. 23, 2023     (KR) ........................ 10-2023-0024647

(51) Int. Cl.
*G11C 29/44*     (2006.01)
*G11C 29/12*     (2006.01)
*G11C 29/24*     (2006.01)

(52) U.S. Cl.
CPC ........ *G11C 29/44* (2013.01); *G11C 29/12015* (2013.01); *G11C 29/24* (2013.01)

(58) Field of Classification Search
CPC ... G11C 29/44; G11C 29/12015; G11C 29/24; G11C 29/76; G11C 2029/4402; G11C 29/02; G11C 29/4401; G11C 29/18; G11C 29/808
See application file for complete search history.

(56) References Cited

U.S. PATENT DOCUMENTS

| | | | |
|---|---|---|---|
| 6,704,228 | B2 | 3/2004 | Jang et al. |
| 6,920,073 | B2 | 7/2005 | Lee |
| 8,248,871 | B2 | 8/2012 | Park et al. |
| 9,576,680 | B1 | 2/2017 | Lee |
| 10,134,483 | B2 | 11/2018 | Varadarajan et al. |

(Continued)

FOREIGN PATENT DOCUMENTS

| | | |
|---|---|---|
| KR | 100498456 B1 | 7/2005 |
| KR | 100499640 B1 | 7/2005 |

(Continued)

*Primary Examiner* — Xiaochun L Chen
(74) *Attorney, Agent, or Firm* — Wolf, Greenfield & Sacks, P.C.

(57)     ABSTRACT

A method of testing a repair circuit of a memory device. The method may include storing first addresses in a first register of the repair circuit, wherein the first register is configured to store faulty addresses during a normal operation of the memory device, and the repair circuit is configured to perform a repair operation to replace the faulty addresses with redundancy addresses, storing test addresses in a second register of the repair circuit, wherein the test addresses are provided from a test host, outputting hit signals by comparing bit values of the addresses stored in the first register with bit values of the addresses stored in the second register, outputting repair enable signals based on the hit signals, and determining a status of a path where the repair enable signals are generated based on logic levels of the repair enable signals.

18 Claims, 19 Drawing Sheets

(56)                          References Cited

U.S. PATENT DOCUMENTS

| 10,839,934 | B2 | 11/2020 | Mathur et al. |
| 11,015,547 | B2 | 5/2021 | Morzano |
| 11,527,303 | B2 | 12/2022 | Ryu et al. |
| 11,651,831 | B2 | 5/2023 | Lim et al. |
| 2008/0175079 | A1* | 7/2008 | Jeon ..................... G11C 29/846 |
| | | | 365/201 |

FOREIGN PATENT DOCUMENTS

| KR | 101608739 | B1 | 4/2016 |
| KR | 20210050213 | A | 5/2021 |
| KR | 20210147523 | A | 12/2021 |
| KR | 102474304 | B1 | 12/2022 |

* cited by examiner

Figure 12:
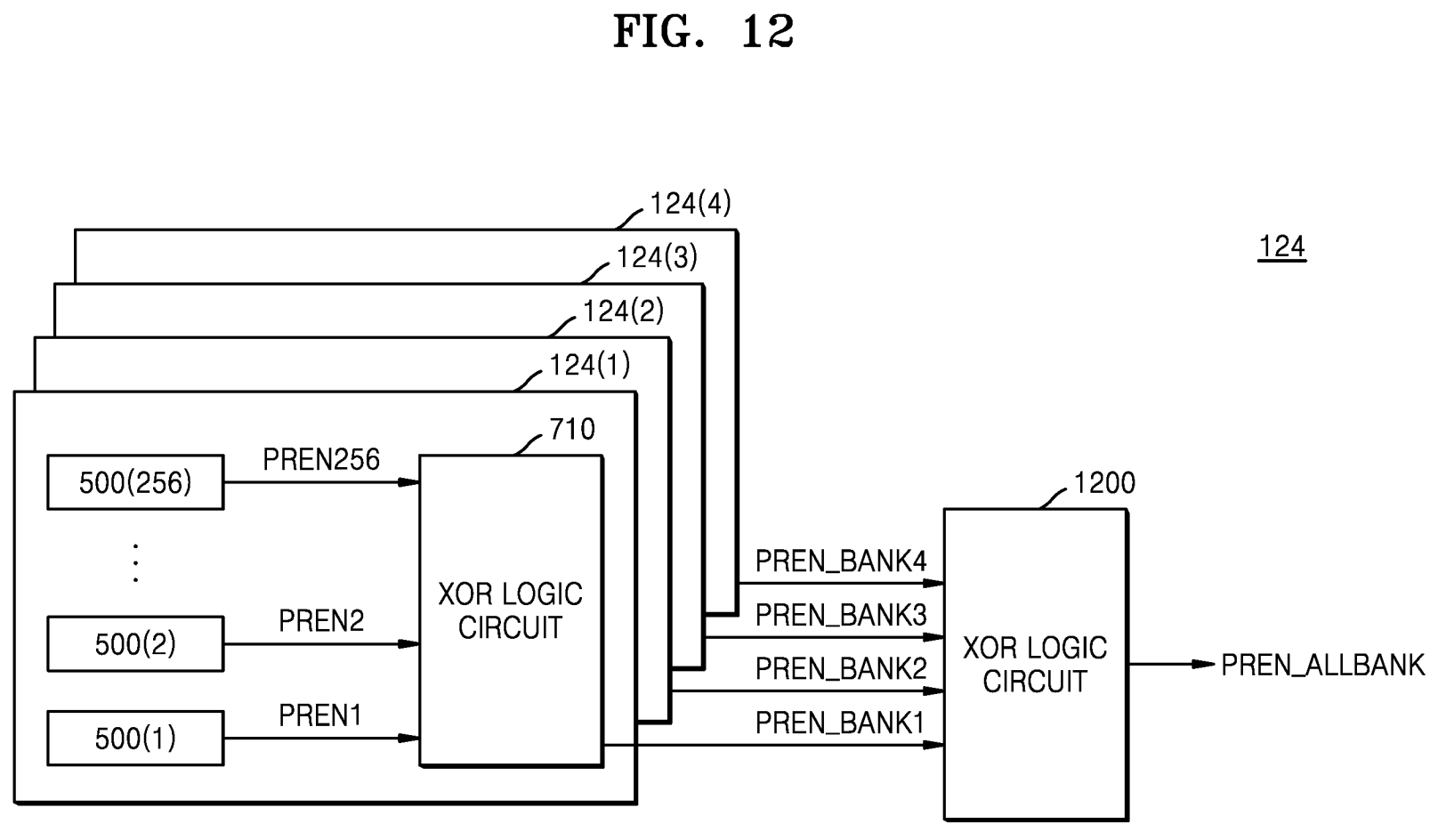

500(256) — PREN256

500(2) — PREN2

· · ·

500(1) — PREN1

710 XOR LOGIC CIRCUIT

124(1)
124(2)
124(3)
124(4)

PREN_BANK4
PREN_BANK3
PREN_BANK2
PREN_BANK1

1200 XOR LOGIC CIRCUIT

PREN_ALLBANK

TEST START

PRESET RA[15:0] ADDRESS "0xEFFF"
TO FIRST AND SECOND REGISTERS OF FAM          — S1410

PROVIDE RA[15:0] ADDRESS "0xFFFF"
TO SECOND REGISTER OF FAM          — S1420

MONITOR TOGGLING OF PRENiB          — S1430

DETERMINE PASS/FAIL OF HIT<15> SCAN PATH          — S1440

END

FIG. 15

| INDEX | HIT[15:0] | | PRENiB MONITORING | |
| --- | --- | --- | --- | --- |
| | PRESET PATTERN | TEST PATTERN | PRESET | TEST |
| 1 | 0x0000 | 0x0010 | 0 | 1 |
| 2 | 0x0BFC | 0x0000 | 1 | 0 |
| 3 | 0x0000 | 0x6600 | 0 | 1 |
| 4 | 0xFF24 | 0x0000 | 1 | 0 |
| 5 | 0xFFFF | 0xFFEF | 0 | 1 |
| 6 | 0x0A03 | 0xFFFF | 1 | 0 |
| 7 | 0xFFFF | 0x63FF | 0 | 1 |
| 8 | 0x0127 | 0xFFFF | 1 | 0 |

METHODS OF TESTING REPAIR CIRCUITS OF MEMORY DEVICES

CROSS-REFERENCE TO RELATED APPLICATION

This application is based on and claims priority under 35 U.S.C. § 119 to Korean Patent Application No. 10-2023-0024647, filed on Feb. 23, 2023, in the Korean Intellectual Property Office, and the entire contents of the above-identified application are incorporated by reference herein.

TECHNICAL FIELD

The inventive concept relates to semiconductor memory devices and methods, and more particularly, to test methods which may improve yield and reliability of memory devices by detecting faults in repair circuits.

BACKGROUND

Semiconductor chips are made through a semiconductor manufacturing process and then tested by test equipment in a wafer, die, or package state. Faulty parts or faulty chips are identified and selected through tests, and when some memory cells are faulty, a repair operation may be performed to save the semiconductor chips. As fine processing continues, certain semiconductor chips, such as dynamic random access memory (DRAM), are more likely to have errors caused from the manufacturing process. In addition, errors may occur during chip operation, even though they are not detected in the initial test stage.

The demand for high-capacity DRAM is increasing for stable and fast real-time processing of large amounts of data. However, the performance quality of DRAM may change over time. A memory system may expect reliability, availability, and serviceability (RAS) functions for DRAM. Accordingly, certain DRAM may detect faulty memory cell(s) in a memory cell array (MCA) in a test operation on the MCA and perform a repair operation to replace the faulty memory cell(s) with redundancy memory cell(s), and may include a repair circuit configured to perform the repair operation.

The repair circuit may store faulty addresses of faulty memory cells detected in the test operation, and may generate repair control signals instructing the repair operation to be performed on the faulty addresses. The DRAM may perform the repair operation to replace faulty wordlines selected by the faulty addresses with redundancy wordlines and/or to replace faulty bitlines selected by the faulty addresses with redundancy bitlines based on the repair control signals.

However, when the repair circuit is faulty, i.e., when there are defects or faults in connection line(s) and/or element(s) constituting the repair circuit, the repair operation on the faulty memory cells may not be performed. In addition, faults in the repair circuit may degrade yield and may reduce reliability in subsequent processes of the memory device. Accordingly, if the operation of the repair circuit can be verified by testing the repair circuit, it may be beneficial to improve the yield and reliability of the memory device while maintaining the quality of the repair circuit.

SUMMARY

The inventive concept provides test methods which may improve yield and reliability of memory devices by detecting faults in repair circuits.

According to some aspects of the inventive concept, there is provided a method of testing a repair circuit of a memory device, and the method may include storing first addresses in a first register of the repair circuit, wherein the first register is configured to store faulty addresses during a normal operation of the memory device, and the repair circuit is configured to perform a repair operation to replace the faulty addresses with redundancy addresses, storing test addresses in a second register of the repair circuit, wherein the test addresses are provided from a test host, outputting hit signals by comparing bit values of the first addresses stored in the first register with bit values of the test addresses stored in the second register, outputting repair enable signals based on the hit signals, and determining a status of a path where the repair enable signals are generated based on logic levels of the repair enable signals.

According to some aspects of the inventive concepts, there is provided a method of testing a repair circuit of a memory device, the method including presetting first addresses to a first register and a second register of the repair circuit, wherein the first register is configured to store faulty addresses during a normal operation of the memory device, and the repair circuit is configured to perform a repair operation to replace the faulty addresses with redundancy addresses, providing test addresses to the second register, wherein the test addresses are provided from a test host and are addresses configured to cause the repair enable signals to toggle, outputting hit signals by comparing bit values of the first addresses stored in the first register with bit values of the test addresses stored in the second register, outputting the repair enable signals based on the hit signals, and determining a status of a path where the repair enable signals are generated based on the toggling of the repair enable signals.

According to some aspects of the inventive concepts, there is provided a memory device including a memory cell array including memory banks, wherein each of the memory banks includes a plurality of memory cells arranged at intersections of a plurality of rows and a plurality of columns, and redundancy memory cells for repairing faulty memory cells among the plurality of memory cells, and for each of the memory banks, a repair circuit configured to include a plurality of unit circuits configured to generate repair enable signals that instruct a repair operation on the faulty memory cells. The unit circuits of the repair circuit includes fail address memory including a first register and a second register, the first register configured to store first addresses and the second register configured to store test addresses, wherein the test addresses are provided from a test host, a comparison circuit configured to output hit signals by comparing bit values of the first addresses stored in the first register with bit values of the test addresses stored the second register, and a combinational logic circuit configured to output the repair enable signals based on the hit signals, wherein a status of a path where the repair enable signals are generated is determined based on logic levels of the repair enable signals.

BRIEF DESCRIPTION OF THE DRAWINGS

Some embodiments of the present inventive concepts will be more clearly understood from the following detailed description taken in conjunction with the accompanying drawings in which:

FIG. 3 is a block diagram of a memory device including a repair circuit according to some embodiments;

FIG. 12 is a circuit diagram of a repair circuit according to some embodiments;

FIGS. 13, 14, and 15 are diagrams illustrating a method of scan testing a repair circuit according to some embodiments.

DETAILED DESCRIPTION OF THE EMBODIMENTS

Figure 1:
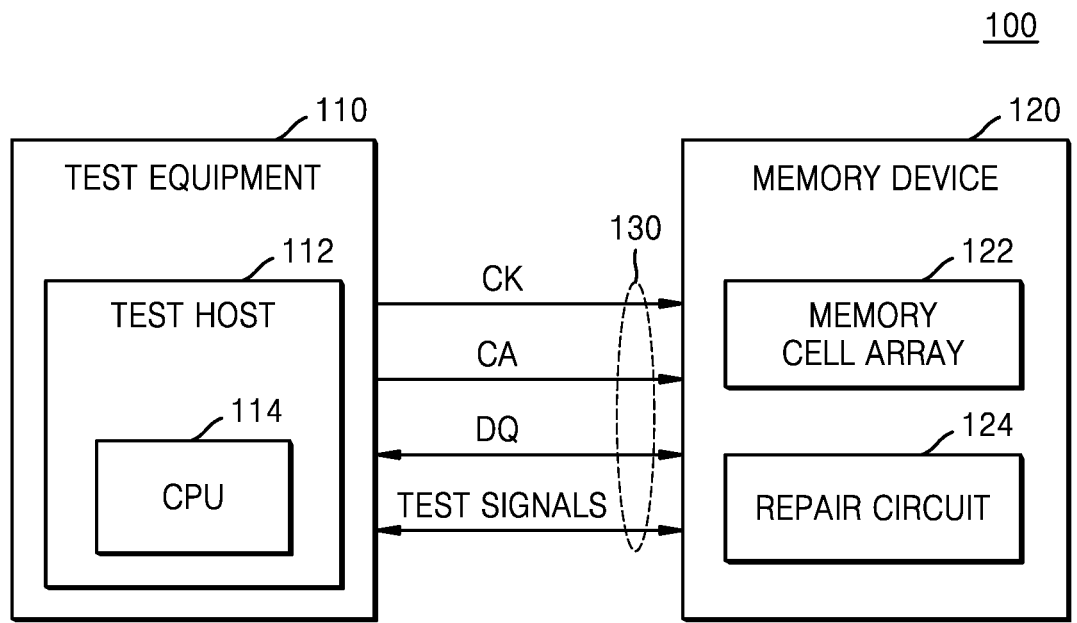
FIG. 1 is a conceptual diagram of a test system for testing a memory device according to some embodiments.
Figure 2A:
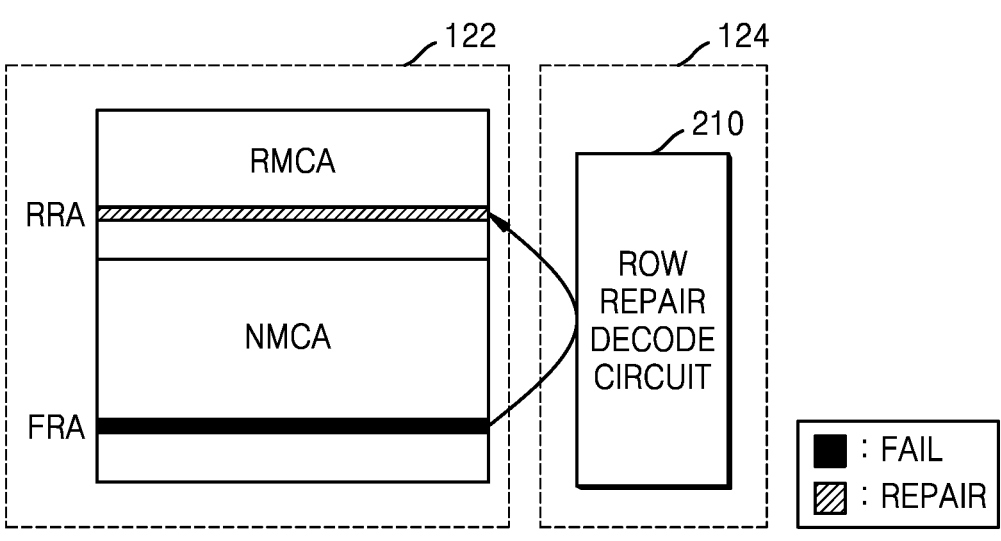
FIGS. 2A and 2B are diagrams illustrating a repair operation by a repair circuit of FIG. 1.
Figure 2B:
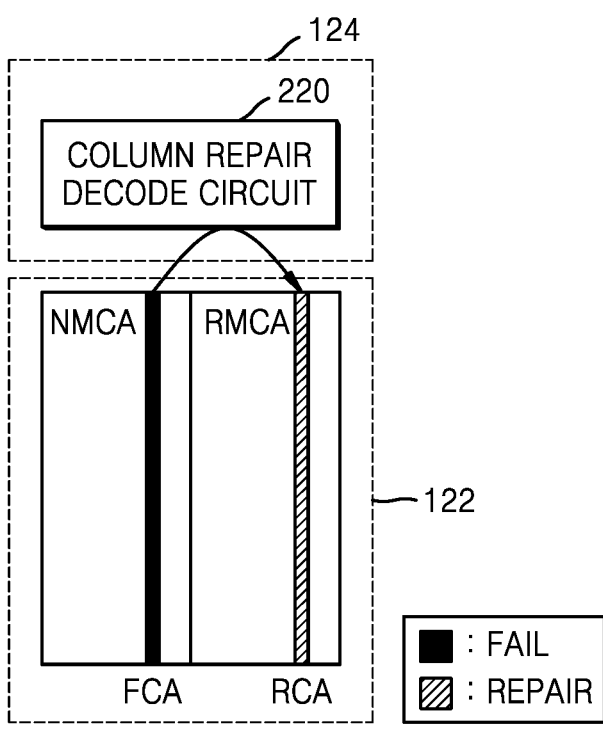

FIG. 1 is a conceptual diagram of a test system for testing a memory device according to some embodiments. FIGS. 2A and 2B are diagrams illustrating a repair operation that may be performed by a repair circuit 124 of FIG. 1.

Referring to FIG. 1, a method of testing a memory device 120 may be performed by test equipment 110 in a test system 100. The test equipment 110 may include a test host 112 for testing the memory device 120, which may be a device under test (DUT). The test host 112 may include a central processing unit 114 that controls hardware, software, and/or firmware to perform a test operation on the memory device 120. The test host 112 may transmit test signals of the central processing unit 114 to the memory device 120, and/or may transmit performance result values of the test signals output from the memory device 120 to the central processing unit 114.

The test host 112 may be implemented as a test program. The test program may include a test algorithm or pattern for performing the test operation. For example, the test host 112 may store particular data in a storage area of the DUT, i.e., a memory cell array 122 of the memory device 120, read the data, and then determine a pass or fail status of the test operation depending on whether the read data is identical to the particular data. The test host 112 may measure a change in voltage, current, and/or frequency under various driving conditions for the memory device 120 to test whether the range of the change is acceptable. The test host 112 may test the operation of a particular circuit of the memory device 120, and in particular may test the repair circuit 124 to detect faults in the repair circuit 124.

The memory device 120 may be implemented as, but is not limited to, DRAM. For example, the memory device 120 may correspond to double data rate synchronous dynamic random access memory (DDR SDRAM), low power double data rate (LPDDR) SDRAM, graphics double data rate (GDDR) SDRAM, Rambus dynamic random access memory (RDRAM), or the like. Alternatively, the memory device 120 may also be implemented as static DRAM (SDRAM), high bandwidth memory (HBM), or processor-in-memory (PIM).

According to some embodiments, the memory device 120 may be implemented as a non-volatile memory device. For example, the memory device 120 may be implemented as flash memory or resistive memory, such as phase change RAM (PRAM), magnetic RAM (MRAM), resistive RAM (RRAM), or the like.

The test host 112 may test the memory device 120 via channels 130. The channels 130 may include buses and/or signal lines that physically and/or electrically connect the test host 112 and the memory device 120. For example, a clock signal CK may be received by the memory device 120 via a clock bus, a command and address signal CA may be received by the memory device 120 via a command/address bus, and data signals DQ may be provided between the test host 112 and the memory device 120 via a data bus. In addition, the test signals may be provided between the test host 112 and the memory device 120 via test signal lines. For simplicity in the drawing, it is illustrated that signals are transmitted through one signal line between the test host 112 and the memory device 120, but in reality, each bus may include one or more signal lines through which the signals are provided.

The test host 112 may provide commands to the memory device 120 to test memory operations thereof. Non-limiting examples of memory commands may include a timing command for controlling the timing of various operations, an access command for accessing memory, e.g., a read command for performing a read operation and/or a write command for performing a write operation, a mode register write and/or read command for performing a mode register write or read operation, a repair command, or the like.

During testing, when the write command and the related address are provided to the memory device 120 by the test host 112, the memory device 120 may receive the write command and the related address, and may perform a write operation to write the write data from the test host 112 to a memory location corresponding to the related address. The write data may be provided by the test host 112 to the memory device 120 according to the timing related to the reception of the write command. For example, the timing may be based on a write latency (WL) value that indicates the number of clock cycles after the write command when the write data is provided to the memory device 120 by the test host 112. The WL value may be programmed into a mode register set (MRS) of the memory device 120 by the test host 112. As is known, the MRS of the memory device 120 may be programmed with information for setting various operation modes and/or selecting features for memory operation. In addition, information for the test operation of the memory device 120 may be stored in a test mode register set (TMRS).

During testing, when the read command and the related address are provided to the memory device 120 by the test host 112, the memory device 120 may receive the read command and the related address, and may perform a read operation to output the read data from a memory location corresponding to the related address. The read data may be provided by the memory device 120 to the test host 112 according to the timing related to the reception of the read command. For example, the timing may be based on a read latency (RL) value that indicates the number of clock cycles after the read command when the read data is provided to the test host 112 by the memory device 120. The RL value may be set in the memory device 120 by the test host 112. For example, the RL value may be programmed into the MRS of the memory device 120.

The test host 112 may provide a repair command and a faulty address to the memory device 120. The repair command includes a post package repair (PPR) command, and the PPR command may cause the memory device 120 to store the faulty address detected after the memory device 120 is packaged in non-volatile memory (e.g., a fuse array) in the memory device 120, and instructs a repair operation on the faulty address to be performed. In response to the PPR command, the memory device 120 may perform a PPR operation to replace a faulty wordline selected by the faulty address with a redundancy wordline and/or to replace a faulty bitline selected by the faulty address with a redundancy bitline.

The memory device 120 may include the memory cell array 122 and a repair circuit 124. The memory cell array 122 may have a plurality of rows and a plurality of columns, and may include a plurality of memory cells formed at intersections of the rows and the columns. The memory cells of the memory cell array 122 may be volatile memory cells, e.g., DRAM cells. In addition, the memory cell array 122 may have redundancy rows and/or redundancy columns to which redundancy memory cells are connected, which may be used to repair faulty memory cells when defects or faults occur in the memory cells.

The repair circuit 124 may be configured to repair the faulty memory cells detected in the memory cell array 122 into the redundancy memory cells. The repair circuit 124 may repair faulty memory cells that are detected through an electrical die sorting (EDS) test after a semiconductor manufacturing process of the memory device 120. In addition, the repair circuit 124 may perform a PPR operation to repair the faulty memory cells generated during package/module/mounting tests of the memory device 120 into the redundancy memory cells.

As shown in FIGS. 2A and 2B, the repair circuit 124 may perform a repair operation to replace a faulty row address FRA and/or a faulty column address FCA with a redundancy row address RRA and/or a redundancy column address RCA, respectively.

In FIG. 2A, the repair circuit 124 may repair the faulty row address FRA related to the faulty memory cells into the redundancy row address RRA. The memory cell array 122 may include a normal memory cell array NMCA and a redundancy memory cell array RMCA. The normal memory cell array NMCA may include memory cells connected to wordlines and bitlines, and the redundancy memory cell array RMCA may include memory cells connected to redundancy wordlines and/or redundancy bitlines. The repair circuit 124 may include a row repair decode circuit 210 that determines the redundancy row address RRA such that redundancy resources that repair the faulty row address FRA do not overlap. According to some embodiments, the row repair decode circuit 210 may sequentially or randomly set the redundancy row address RRA that repairs the faulty row address FRA within the redundancy memory cell array RMCA.

The row repair decode circuit 210 may perform a row repair operation to select the redundancy row address RRA instead of the faulty row address FRA. When an access row address applied to the memory device 120 designates the faulty row address FRA of the normal memory cell array NMCA, redundancy memory cells corresponding to the redundancy row address RRA of the redundancy memory cell array RMCA are selected. The row repair decode circuit 210 may deactivate the wordline corresponding to the faulty row address FRA, and instead activate the redundancy wordline corresponding to the redundancy row address RRA. Accordingly, the redundancy memory cells corresponding to the redundancy row address RRA may be selected instead of the memory cells corresponding to the faulty row address FRA.

In FIG. 2B, the repair circuit 124 may perform a column repair operation to select the redundancy column address RCA instead of the faulty column address FCA. The repair circuit 124 may include a column repair decode circuit 220 that determines the redundancy column address RCA such that redundancy resources that repair the faulty column address FCA do not overlap. According to some embodiments, the column repair decode circuit 220 may sequentially or randomly set the redundancy column address RCA of the redundancy memory cell array RMCA that repairs the faulty column address FCA.

The column repair decode circuit 220 may perform a repair operation to select the redundancy column address RCA instead of the faulty column address FCA. When an access column address applied to the memory device 120 designates the faulty column address FCA of the normal memory cell array NMCA, the redundancy memory cells corresponding to the redundancy column address RCA of the redundancy memory cell array RMCA are selected. The column repair decode circuit 220 prevents the bitline corresponding to the faulty column address FCA from being selected, and instead selects the redundancy bitline corresponding to the redundancy column address RCA. Accordingly, the redundancy memory cells corresponding to the redundancy column address RCA may be selected instead of the memory cells corresponding to the faulty column address FCA.

The repair circuit 124 may store redundancy mapping information which indicates that the faulty address (e.g., faulty row address FRA and/or faulty column address FCA) has been replaced with a redundancy address (e.g., redundancy row address RRA and/or redundancy column address RCA) by performing a repair operation. The repair circuit 124 may store the faulty address using a fuse array (e.g., 400 of FIG. 4) including antifuses, wherein the antifuses have a characteristic that their states are converted from a high resistance state to a low resistance state by an electrical signal (e.g., high voltage signal). The repair circuit 124 may compare the access address applied to the memory device 120 with the faulty address stored in the fuse array, and may control the redundancy memory cells corresponding to the redundancy address to be selected instead of the memory cells corresponding to the faulty address when the comparison result indicates that the access address matches the faulty address.

However, when the repair circuit 124 itself is defective or faulty, a repair operation on the faulty memory cells may become unstable or impossible. Although the memory device 120 on which the unstable repair operation has been performed may pass the EDS test, the memory device 120 may be processed as a fail because the PPR operation of the repair circuit 124 on the faulty memory cells generated during the subsequent package, module, and mounting tests of the memory device 120 becomes unstable or impossible. As a result, yield and reliability in the subsequent processes of the memory device 120 may deteriorate. If the repair circuit operation can be verified by testing the repair circuit 124, the repair circuit 124 may be processed as faulty by detecting the faulty repair circuit and determining that it is not possible to repair the faulty repair circuit. Therefore, the subsequent processes and/or tests to ensure good quality of the memory device 120 may be stopped, thereby improving yield and reliability. In the following embodiments, the repair circuit 124 and a method of testing the repair circuit 124 are described.

Figure 3:
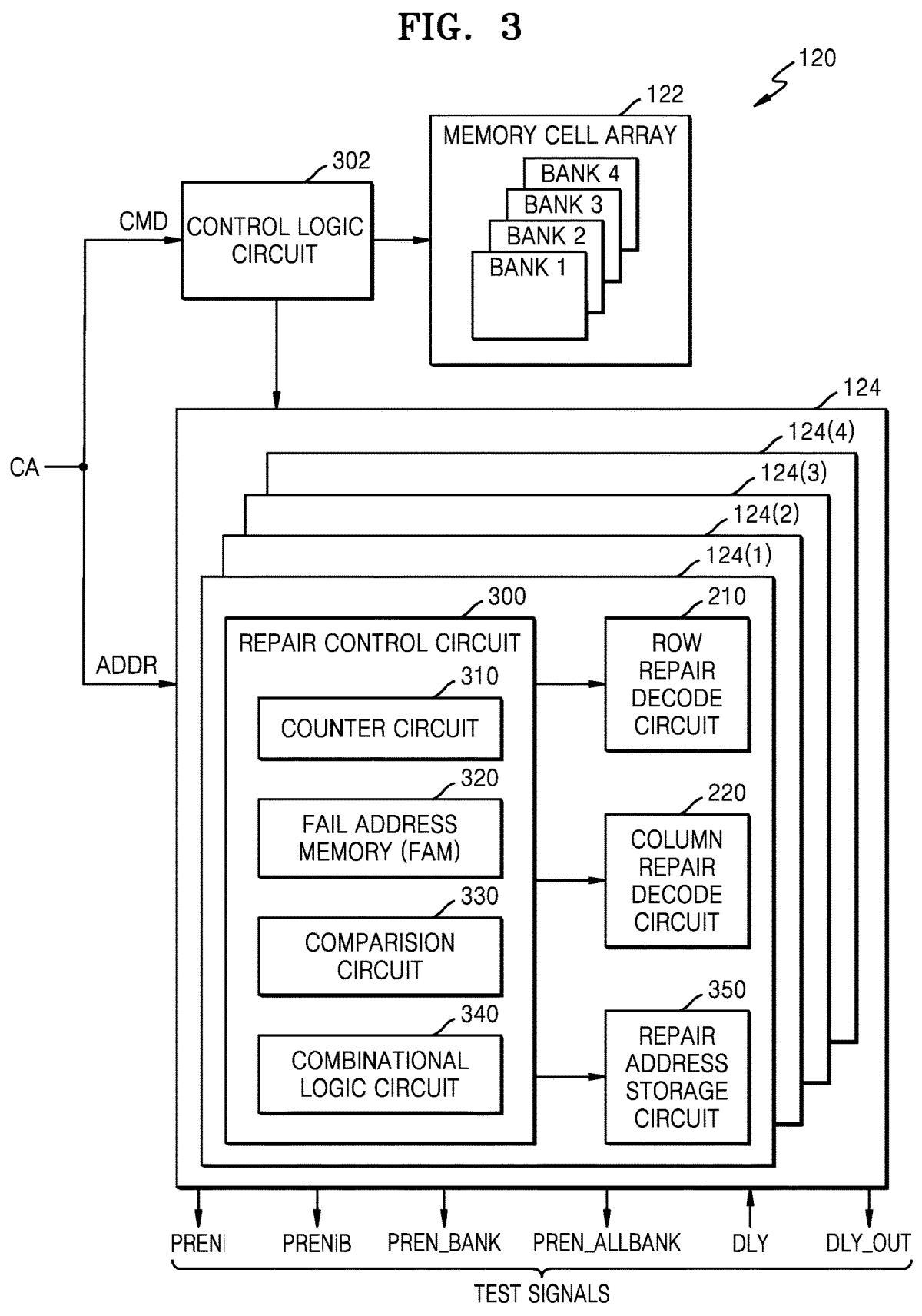
Figure 4:
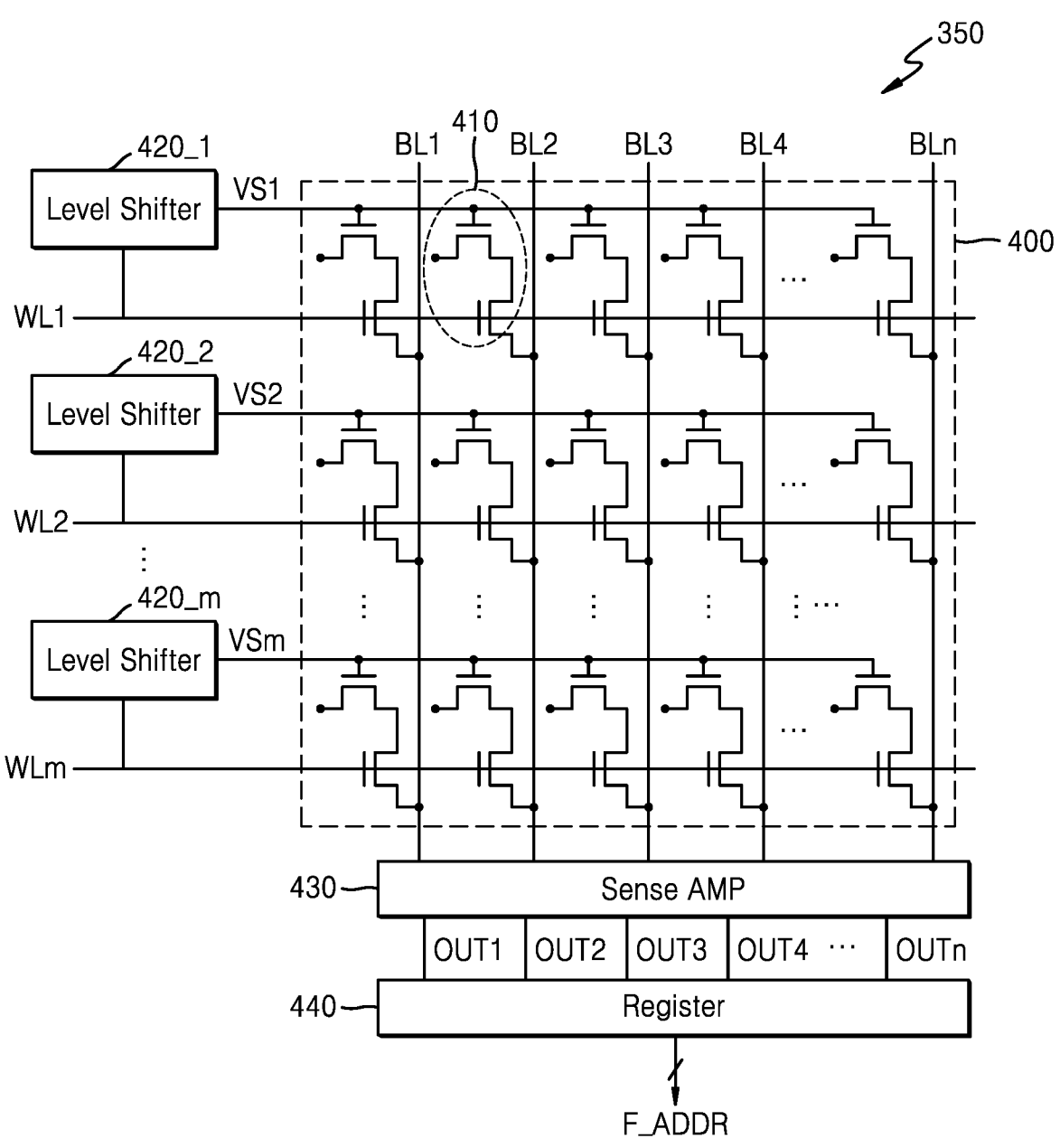
FIG. 4 is a diagram of a repair address storage circuit of FIG. 3.

FIG. 3 is a block diagram of a memory device 120 including a repair circuit according to some embodiments. FIG. 4 is a diagram of a repair address storage circuit of FIG. 3.

Referring to FIG. 3 in association with FIGS. 1, 2A, and 2B, the memory device 120 may include the memory cell array 122, a control logic circuit 302, and the repair circuit 124. Although not shown in FIG. 3, the memory device 120 may further include a row decoder, a wordline driver, a column decoder, a read/write circuit, a clock circuit, an address buffer, an MRS, an input/output (I/O) circuit, and the like. The configuration of the memory device 120 shown in FIG. 3 does not represent or suggest limitations to the present disclosure.

The memory cell array 122 may include first to fourth banks BANK1 to BANK4. A row decoder and a column decoder may be arranged corresponding to each of the first to fourth banks BANK1 to BANK4, and the row decoder and the column decoder connected to a bank that corresponds to a bank address may be activated. Each of the first to fourth banks BANK1 to BANK4 may include a plurality of memory cells provided in a matrix form arranged in rows and columns and redundancy memory cells connected to redundancy rows and/or redundancy columns.

The control logic circuit 302 may receive a command through the command/address CA bus of the channels 130 and may generate control signals corresponding to the command. The memory operation may be performed according to the operation timing of the memory device 120 by the control logic circuit 302. The control logic circuit 302 may receive a repair command from the test host 112 during testing, and may control the repair operation of the repair circuit 124 to be performed according to the repair command.

The repair circuit 124 may include first to fourth repair circuits 124(1) to 124(4) corresponding to the first to fourth banks BANK1 to BANK4, respectively. Each of the first to fourth repair circuits 124(1) to 124(4) may include a row repair decode circuit 210, a column repair decode circuit 220, a repair control circuit 300, and a repair address storage circuit 350. The row repair decode circuit 210 (which may correspond to the row repair decode circuit 210 in FIG. 2A) and the column repair decode circuit 220 (which may correspond to the column repair decode circuit 220 in FIG. 2B) may be configured to perform the repair operation to select the redundancy address (e.g., redundancy row address RRA and/or redundancy column address RCA) instead of the faulty address (e.g., faulty row address FRA and/or faulty column address FCA) based on the repair control signals generated from the repair control circuit 300. Each of the first to fourth repair circuits 124(1) to 124(4) may replace the faulty row address FRA and/or the faulty column address FCA of the corresponding bank with the redundancy row address RRA and/or the redundancy column address RCA using the row repair decode circuit 210 and/or the column repair decode circuit 220.

The repair control circuit 300 may include a counter circuit 310, a fail address memory (FAM) 320, a comparison circuit 330, and a combinational logic circuit 340. The repair control circuit 300 may receive and store the faulty address provided from the test host 112 in a register (510 in FIG. 5) of the FAM 320, where the faulty address stored in the FAM 320 may correspond to the faulty row address FRA and/or the faulty column address FCA described with reference to FIGS. 2A and 2B. The repair control circuit 300 may store the faulty address stored in the FAM 320 in the fuse array (400 in FIG. 4) of the repair address storage circuit 350.

Referring to FIG. 4, the repair address storage circuit 350 may include a fuse array 400 in which a plurality of antifuses 410 are arranged, level shifters 420_1 to 420_m generating high voltage for changing the resistance state of the antifuses 410, and a sense amplifier 430 for sensing/amplifying information stored in the fuse array 400. In addition, a register 440 configured to store fuse data that is generated by reading the information stored in the fuse array 400 may be included in the repair address storage circuit 350.

The fuse array 400 includes a plurality of fuses, and information may be stored in each of the fuses. The fuse array 400 may include laser fuses whose connection is controlled by laser irradiation, and/or may include electrical fuses whose connection is controlled by an electrical signal. Alternatively, the fuse array 400 may include antifuses, and the antifuses have a characteristic that their states may be converted from a high resistance state to a low resistance state by the electrical signal (e.g., high voltage signal). Any one of the plurality of types described above may be applied to the fuse array 400, and in the following embodiment, it is assumed that the fuse array 400 includes an antifuse array including antifuses. The fuse array 400 may be used interchangeably with the antifuse array 400. In addition, information stored in the antifuses or data read from the antifuses may be referred to herein as fuse data.

The antifuse array 400 has an array structure in which antifuses 410 are arranged at positions where a plurality of rows cross a plurality of columns. For example, when the antifuse array 400 has m rows and n columns, the antifuse array 400 has m*n antifuses 410. There may be m wordlines WL1 to WLm arranged in m rows and n bitlines BL1 to BLn arranged in n columns for accessing the antifuses 410 and to transfer information read from the antifuses 410 that are provided in the antifuse array 400.

The antifuse array 400 may be programmed by applying voltage signals VS1 to VSm provided from the level shifters 420_1 to 420_m to the antifuse array 400 and changing the state of the antifuses 410. The antifuses 410 may store information when the programming operation changes the state of the antifuses 410 from a high resistance state to a low resistance state. The antifuses 410 may have a structure having two conductive layers and a dielectric layer therebetween, i.e., a capacitor structure, and may be programmed by applying high voltage between the two conductive layers to break down the dielectric layer.

After the antifuse array 400 is programmed, a read operation may be performed on the antifuse array 400 with the start of driving of the memory device 120. The read operation on the antifuse array 400 may be performed simultaneously with the driving of the memory device 120, or may be performed after a preset time from the driving of the memory device 120. Wordline selection signals may be provided through the wordlines WL1 to WLm of the antifuse array 400, and information stored in the selected antifuses 410 may be provided through the bitlines BL1 to BLn to the sense amplifier 430. Due to the nature of the array structure, information of the antifuse array 400 may be randomly accessed through driving of the wordlines WL1 to WLm and the bitlines BL1 to BLn.

For example, as the wordlines WL1 to WLm are sequentially driven, the antifuses 410 from the first row to the $m^{th}$ row of the antifuse array 400 may be sequentially accessed. The information of the sequentially accessed antifuses 410 may be provided to the sense amplifier 430. The sense amplifier 430 includes one or more sense amplifier circuits. For example, when the antifuse array 400 has n columns, the sense amplifier 430 may include n sense amplifier circuits correspondingly. The n sense amplifier circuits may be respectively connected to the n bitlines BL1 to BLn.

The sense amplifier 430 may output the information accessed by the antifuse array 400 by sensing/amplifying signals received from the antifuse array 400. Fuse data OUT1 to OUTn that is output from the sense amplifier 430 may be provided to the register 440. The register 440 may receive the fuse data OUT1 to OUTn in units of rows of the antifuse array 400. For example, when any one row of the antifuse array 400 is selected, the fuse data OUT1 to OUTn from the antifuses 410 connected to the wordlines of the selected row may be provided to the register 440 in parallel. The fuse data OUT1 to OUTn stored in the register 440 may be information for the repair operation, e.g., faulty address F_ADDR referring to the faulty row address (FRA in FIG. 2A) and/or the faulty column address (FCA in FIG. 2B).

In FIG. 3, the repair circuit 124 may compare the access row address applied to the memory device 120 with the faulty row address FRA stored in the repair address storage circuit 350, and, when the comparison result indicates that the access row address matches the faulty row address FRA, may perform a row repair operation to select the redundancy row address RRA instead of faulty row address FRA using the row repair decode circuit 210, as illustrated in FIG. 2A. The repair circuit 124 may compare the access column address applied to the memory device 120 with the faulty column address FCA, and, when the comparison result indicates that the access column address matches the faulty column address FCA, may perform a column repair operation to select the redundancy column address RCA instead of the faulty column address FCA. The operation of the repair circuit 124 itself may be verified e.g., to perform such repair operations in a stable manner.

Figure 5:
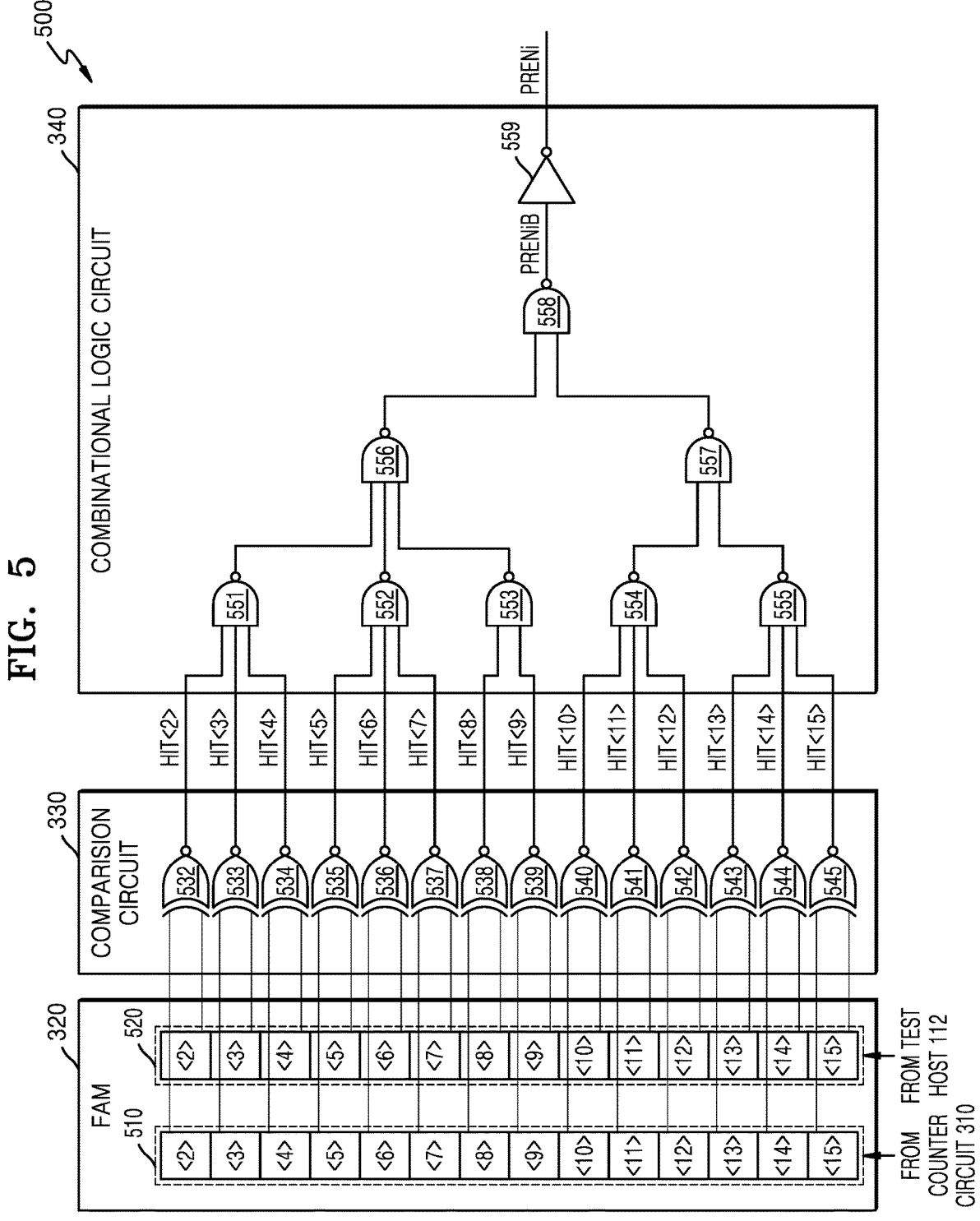
FIGS. 5, 6, and 7 are diagrams of a repair circuit according to some embodiments.
Figure 6:
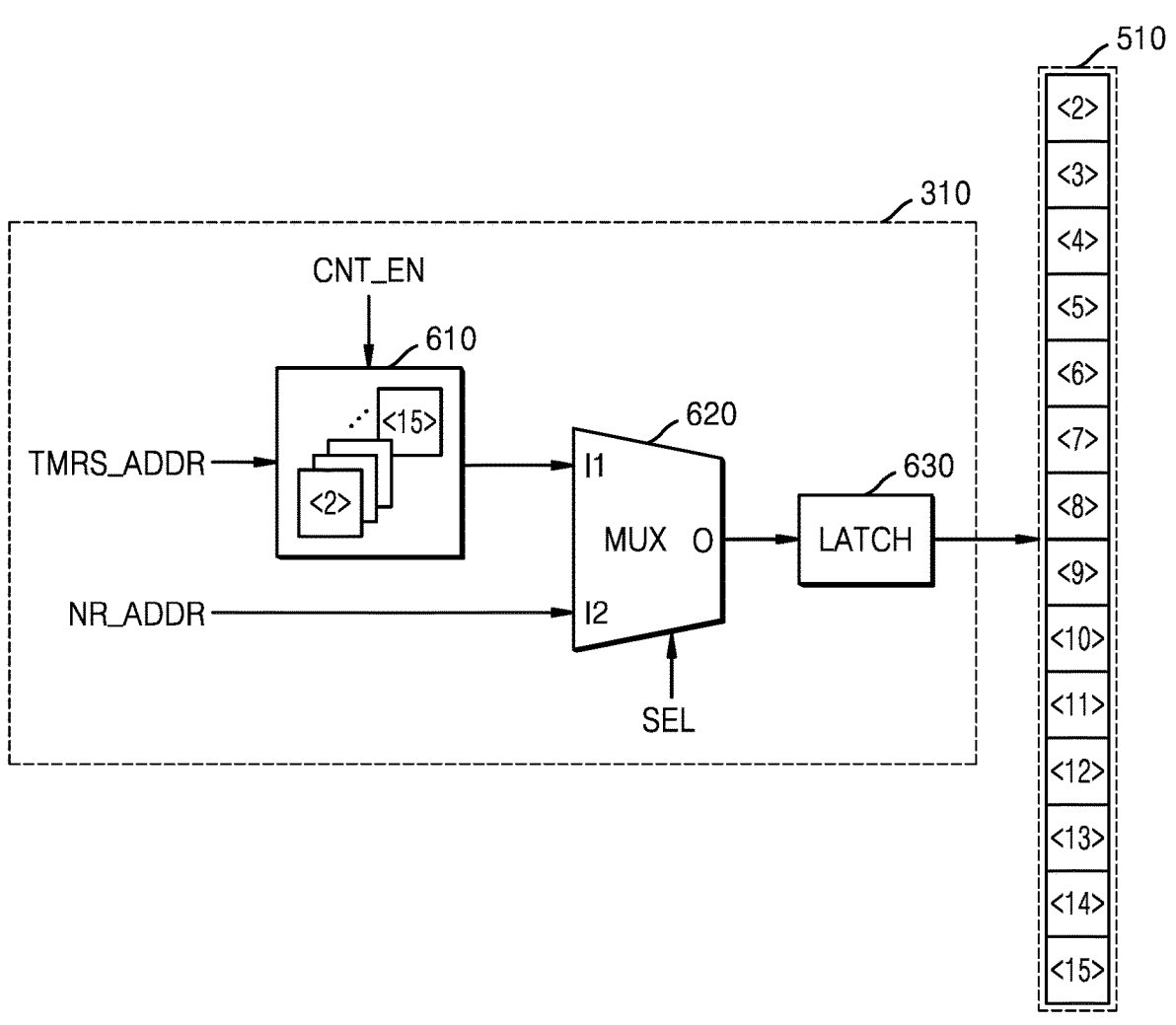
Figure 7:
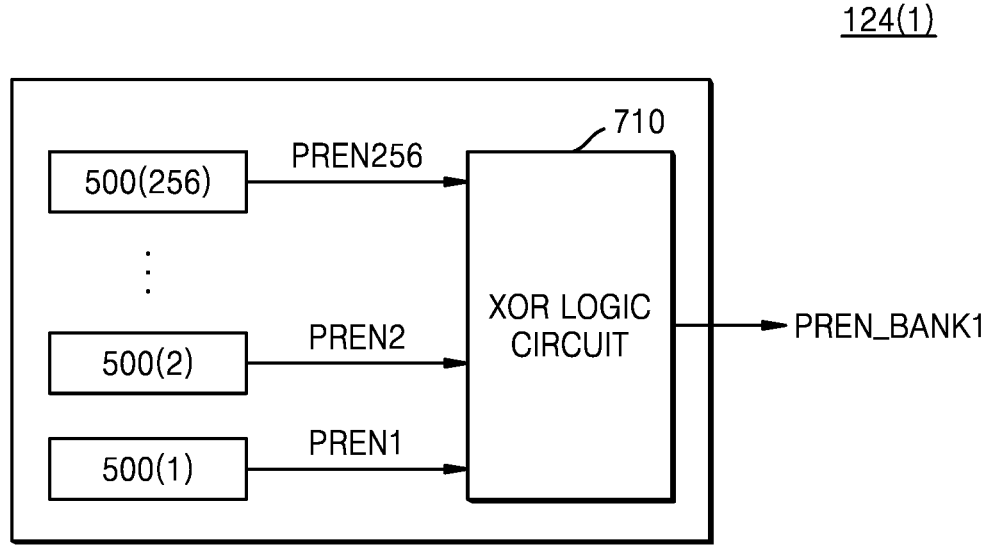

FIGS. 5-7 are diagrams of a repair circuit according to some embodiments. FIGS. 5 to 7 illustrate the operation of the first repair circuit 124(1) corresponding to the first bank BANK1. FIG. 5 is a circuit diagram of a unit circuit 500 configured to generate a repair enable signal PRENi related to one faulty row address and may among a plurality of unit circuits constituting the repair control circuit 300 in the first repair circuit 124(1). FIG. 6 is a circuit diagram of a counter circuit 310 configured to generate addresses stored in the first register 510 of the unit circuit 500 of FIG. 5. FIG. 7 is a block diagram of the first repair circuit 124(1) configured to generate a first bank repair enable signal PREN_BANK1 related to the first bank BANK1.

Referring to FIGS. 3 and 5, the unit circuit 500 configured to generate one repair enable signal PRENi may include the FAM 320 including the first register 510 and a second register 520, the comparison circuit 330 including XNOR logic circuits 532 to 545, and the combinational logic circuit 340 including NAND logic circuits 551 to 558 and an inverter circuit 559. The unit circuit 500 includes, e.g., circuits that operate with 14 bits of row address RA[15:2], excluding lower 2 bits of row address RA[1:0], among 16 bits of row address RA[15:0]. The example of the unit circuit 500 for the 14 bits of row address RA[15:2] does not represent or suggest limitations to the present disclosure. According to an embodiment, a unit circuit may be applied to a smaller or larger number of bits of address than the present disclosure.

In some embodiments, each of the banks BANK1 to BANK4 in the memory cell array 122 may include a plurality of memory blocks to which 64K wordlines corresponding to the row address RA[15:0] are connected, and may include main wordline drivers and sub-wordline drivers connected to each of the plurality of memory blocks. The main wordline drivers connected to the row decoder may activate main wordline driving signals corresponding to the decoded 14 bits of row address RA[15:2], and may activate sub-wordline driving signals corresponding to the decoded lower 2 bits of row address RA[1:0]. The sub-wordline drivers may include, e.g., an inverter circuit including a PMOS transistor and an NMOS transistor, and may include a circuit where the main wordline driving signals are connected to gates of the PMOS transistor and the NMOS transistor, the sub-wordline driving signals may be connected to a source of the PMOS transistor, and sub-word-lines may be connected to a drain of the PMOS transistor. According to the structures of the main wordline drivers and the sub-wordline drivers, wordlines of each of the banks BANK1 to BANK4 may be predominantly activated in response to the main wordline driving signals. Therefore, the wordlines of each of the banks BANK1 to BANK4 may be accessed by the 14 bits of row address RA[15:2].

The FAM 320 may include the first register 510 and the second register 520 implemented as a register array. The first register 510 may store the first addresses provided from the counter circuit 310, and the first addresses may include 14 bits <15:2>. The second register 520 may store second addresses provided from the test host 112, and the second addresses may include 14 bits <15:2> in the same manner as the first addresses. The bits <15:2> of the first and second addresses respectively stored in the first and second registers 510 and 520 may be provided to the comparison circuit 330.

The comparison circuit 330 may include the XNOR logic circuits 532 to 545. The XNOR logic circuits 532 to 545 may compare bit values of the bits <15:2> of the first addresses stored in the first register 510 with bit values of the bits <15:2> of the second addresses stored in the second register 520 on a bit-by-bit basis and may output hit signals HIT [15:2]. The XOR circuit 532 may compare <2> bit values of the first and second addresses and output a hit signal HIT<2>, the XOR circuit 533 may compare <3> bit values of the first and second addresses and output a hit signal HIT<3>, and the XOR circuit 534 may compare <4> bit values of the first and second addresses and output a hit signal HIT<4>. Similarly, the XOR circuit 543 may compare <13> bit values of the first and second addresses and output a hit signal HIT<13>, the XOR circuit 544 may compare <14> bit values of the first and second addresses and output a hit signal HIT<14>, and the XOR circuit 545 may compare <15> bit values of the first and second addresses and output a hit signal HIT<15>.

Each of hit signals HIT[15:2] of the comparison circuit 330 may be output at a high logic level when bit values of the bits <15:2> of the first and second addresses input to the corresponding XNOR logic circuits 532 to 545 are matched, and may be output at a low logic level when mismatched or do not match. For example, the comparison circuit 330 may output all of the hit signals HIT[15:2] at a high logic level when the bits of the first and second addresses respectively stored in the first and second registers 510 and 520 are matched.

The combinational logic circuit 340 may include the NAND logic circuits 551 to 558 and the inverter circuit 559. The NAND logic circuits 551 to 558 may input the hit signals HIT[15:2] output from the comparison circuit 330 and may output pre-repair enable signals PRENiB, and the inverter circuit 559 may input the pre-repair enable signals PRENiB and may output the repair enable signals PRENi. The NAND circuit 551 may input hit signals HIT<2>, HIT<3>, and HIT<4>, the NAND circuit 552 may input hit signals HIT<5>, HIT<6>, and HIT<7>, the NAND circuit

553 may input hit signals HIT<8>, and HIT<9>, the NAND circuit 554 may input hit signals HIT<10>, HIT<11>, and HIT<12>, and the NAND circuit 555 may input hit signals HIT<13>, HIT<14>, and HIT<15>. The NAND circuit 556 may input the output of the NAND circuits 551, 552, and 553, the NAND circuit 557 may input the output of the NAND circuits 554 and 555, and the NAND circuit 558 may input the output of the NAND circuits 556 and 557.

The combinational logic circuit 340 may output the pre-repair enable signals PRENiB at a low logic level and the repair enable signals PRENi at a high logic level when all of the hit signals HIT[15:2] are at a high logic level. It may be determined that the bits of the first and second addresses respectively stored in the first and second registers 510 and 520 are matched based on the pre-repair enable signals PRENiB being at a low logic level and the repair enable signals PRENi being at a high logic level. In addition, it may be determined that the operation of the first repair circuit 124(1) related to a path of the repair enable signals PRENi is good based on the pre-repair enable signals PRENiB being at a low logic level and the repair enable signals PRENi being at a high logic level.

If any one of the hit signals HIT[15:2] is at a low logic level, the combinational logic circuit 340 may output the pre-repair enable signals PRENiB at a high logic level and the repair enable signals PRENi at a low logic level. It may be determined that the bits of the first and second addresses respectively stored in the first and second registers 510 and 520 are mismatched based on the pre-repair enable signals PRENiB being at a high logic level and the repair enable signals PRENi being at a low logic level. In addition, it may be determined that the operation of the first repair circuit 124(1) related to the path of the repair enable signals PRENi has failed based on the pre-repair enable signals PRENiB being at a high logic level and the repair enable signals PRENi being at a low logic level. Accordingly, it may be possible to verify whether the unit circuit 500 operates by setting patterns of the first and second addresses stored in the first and second registers 510 and 520 to be identical or different.

Referring to FIG. 6, the counter circuit 310 may provide the first addresses to the first register 510. The counter circuit 310 may include a counter 610, a multiplexer (MUX) circuit 620, and a latch circuit 630. The counter 610 may receive addresses TMRS_ADDR provided from the TMRS related to the test of the memory device 120, and may output 14 bits <15:2> of address incremented by +1 (or sequentially incremented) in response to count enable signals CNT_EN. The output addresses of the counter 610 may be provided to a first input I1 of the MUX circuit 620. Repair addresses NR_ADDR provided from the test host 112 may be provided to a second input I2 of the MUX circuit 620. The repair addresses NR_ADDR may refer to faulty addresses detected in a previous test process of the memory device 120, and may be the same as the faulty addresses F_ADDR stored in the repair address storage circuit 350. The MUX circuit 620 may select and output the addresses of the first input I1 or the second input I2 in response to selection signals SEL. The addresses selected by the MUX circuit 620 may be stored in the latch circuit 630 and then stored in the first register 510 as the first addresses. The count enable signals CNT_EN and the selection signals SEL applied to the counter circuit 310 may be provided from the TMRS.

Referring to FIG. 7, the first repair circuit 124(1) may include a plurality of unit circuits 500 each generating a respective repair enable signal PRENi described in FIG. 5. For example, 256 unit circuits 500(1) to 500(256) may be included in the first repair circuit 124(1). Each of the unit circuits 500(1) to 500(256) may store different first addresses in the first register 510. It may be understood that the first repair circuit 124(1) may be capable of repairing up to 256 faulty addresses for the first bank BANK1 using 256 unit circuits 500(1) to 500(256).

The unit circuit 500(1) may output a repair enable signal PREN1, the unit circuit 500(2) may output a repair enable signal PREN2, and the unit circuit 500(256) may output a repair enable signal PREN256. The first repair circuit 124(1) may further include an XOR logic circuit 710 that receives repair enable signals PREN1, PREN2, and PREN256 and outputs a first bank repair enable signal PREN_BANK1.

The first repair circuit 124(1) may output the first bank repair enable signal PREN_BANK1 at a low logic level when the logic levels of the repair enable signals PREN1, PREN2, and PREN256 are the same. As described in FIG. 5, when the first and second addresses stored in the first and second registers 510 and 520 are identically set, all of the repair enable signals PREN1, PREN2, and PREN256 may be at a high logic level. Thus, it may be determined that the operation of the first repair circuit 124(1) related to a path of the first bank repair enable signal PREN_BANK1 is good based on the first bank repair enable signal PREN_BANK1 being at a low logic level. However, it may be determined that the operation of the first repair circuit 124(1) related to the path of the first bank repair enable signal PREN_BANK1 has failed when the first bank repair enable signal PREN_BANK1 is output at a high logic level.

On the contrary, the first repair circuit 124(1) may output the first bank repair enable signal PREN_BANK1 at a high logic level when any one of the repair enable signals PREN1, PREN2, and PREN256 has a different logic level. As described in FIG. 5, when the first and second addresses stored in the first and second registers 510 and 520 of a certain unit circuit (e.g., 500(1)) are set differently, and the first and second addresses stored in the first and second registers 510 and 520 of the remaining unit circuits (500(2) and 500(256)) are set identically, the corresponding repair enable signal (e.g., PREN1) may be at a low logic level, and the remaining repair enable signals (PREN2 and PREN256) may be at a high logic level. Therefore, it may be determined that the operation of the first repair circuit 124(1) related to the path of the first bank repair enable signal PREN_BANK1 is good based on the first bank repair enable signal PREN_BANK1 being at a high logic level. However, it may be determined that the operation of the first repair circuit 124(1) related to the path of the first bank repair enable signal PREN_BANK1 has failed when the first bank repair enable signal PREN_BANK1 is output at a low logic level.

When the first bank repair enable signal PREN_BANK1 output from the first repair circuit 124(1) according to the logic levels of the repair enable signals PREN1, PREN2, and PREN256 has an expected logic level, it may be determined that the operation of the first repair circuit 124(1) related to the path of the first bank repair enable signal PREN_BANK1 is good. When the first bank repair enable signal PREN_BANK1 has a logic level different from the expected logic level, it may be determined that the operation of the first repair circuit 124(1) related to the path of the first bank repair enable signal PREN_BANK1 has failed. As such, a status of the operation of the first repair circuit 124(1) related to the path of the first bank repair enable signal PREN_BANK1 may be determined.

Figure 8:
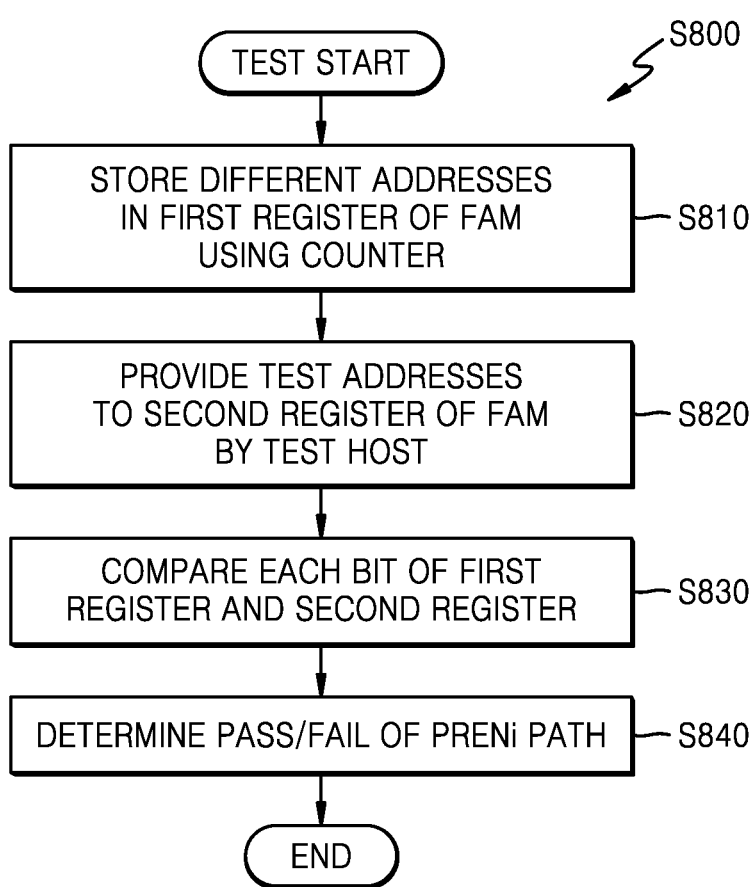
FIGS. 8 and 9 are flowcharts illustrating a method of testing a repair circuit according to some embodiments.
Figure 9:
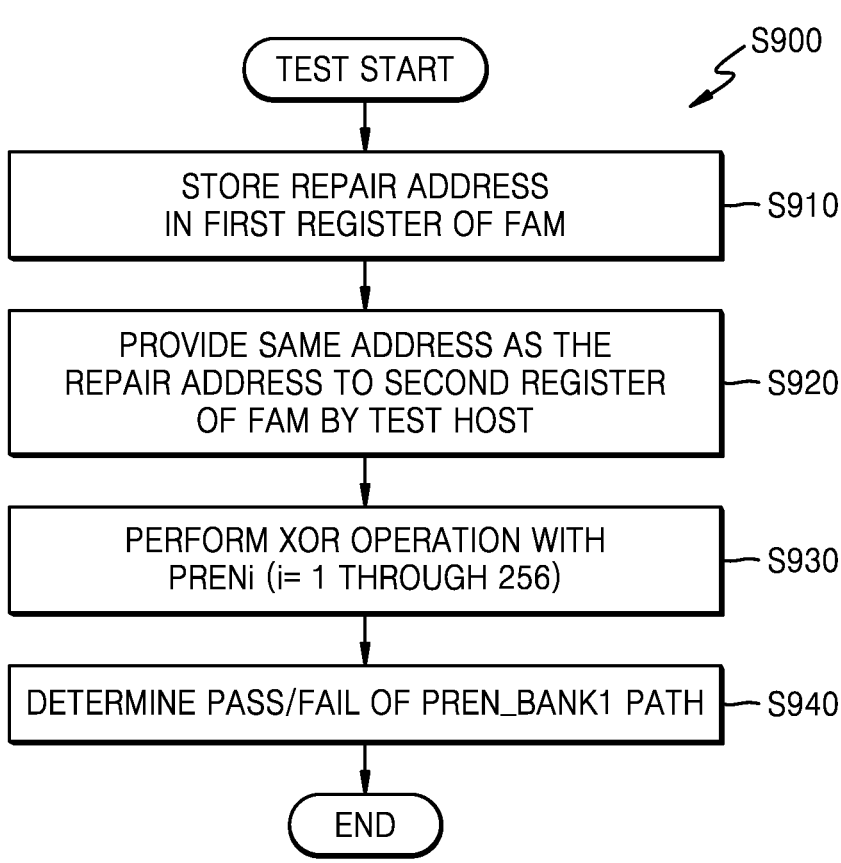

FIGS. 8 and 9 are flowcharts illustrating a method of testing a repair circuit according to some embodiments. FIGS. 8 and 9 are methods of testing the operation of the first repair circuit 124(1) of FIG. 7, and the test method for the first repair circuit 124(1) may be equally applied to the second to fourth repair circuits 124(2), 124(3), and 124(4). In some embodiments, a method of testing the operation of the unit circuits 500(1) to 500(256) outputting the repair enable signals PREN1, PREN2, and PREN256 may be as described with respect to FIGS. 8 and 9, but embodiments of the inventive concepts may not be limited thereto. For example, the method may be described as a method of testing the repair circuit 124 since the unit circuits 500(1) to 500(256) correspond to configurations provided in the repair circuit 124.

Referring to FIG. 8 in association with FIGS. 1 to 7, in a test method S800, individual tests may be performed on each of the repair enable signals PREN1, PREN2, and PREN256. In stage S810, the first repair circuit 124(1) may store different addresses in the first register 510 of each of the 256 unit circuits 500(1) to 500(256). The first repair circuit 124(1) may generate different addresses using the counter 610. The counter 610 may output 14 bits <15:2> of address incremented by +1 (sequentially incremented) based on the addresses TMRS_ADDR provided from the TMRS, and the output addresses of the counter 610 may be stored in the first register 510 of each of the unit circuits 500(1) to 500(256) through the MUX circuit 620 and the latch circuit 630.

In stage S820, the test addresses may be provided to the second register 520 of each of the 256 unit circuits 500(1) to 500(256) by the test host 112. The test host 112 may provide addresses of 64K memory cell rows of the first bank BANK1 as the test addresses.

In stage S830, the first repair circuit 124(1) may compare bits of the addresses stored in the first register 510 with bits of the addresses stored in the second register 520 using the comparison circuit 330. In each of the 256 unit circuits 500(1) to 500(256), the XNOR logic circuits 532 to 545 of the comparison circuit 330 may output the hit signals HIT[15:2] by comparing bit values of the bits <15:2> of the addresses stored in the first register 510 with bit values of the bits <15:2> of the test addresses stored in the second register 520. When the bits of the addresses of the first register 510 match the bits of the test addresses of the second register 510, all of the hit signals HIT[15:2] are output at a high logic level, and the repair enable signals PRENi (i=1 to 256) of each of the unit circuits 500(1) to 500(256) may be output at a high logic level.

In stage S840, the test host 112 may determine pass or fail of the path of the repair enable signals PRENi (i=1 to 256) based on the logic levels of the repair enable signals PRENi (i=1 to 256) output from each of the unit circuits 500(1) to 500(256). Since the addresses stored in the first register 510 of each of the unit circuits 500(1) to 500(256) are values counted by +1 based on the addresses TMRS_ADDR provided from TMRS, the test host 112 knows the addresses of the first register 510 in advance. When the test addresses matching the addresses of the first register 510 are stored in the second register 520 to output the repair enable signals PRENi (i=1~256) at a high logic level and the test addresses mismatching the same are stored in the second register 520 to output the repair enable signals PRENi (i=1~256) at a low logic level, the test host 112 may determine that the path of the repair enable signals PRENi (i=1 to 256) is a pass. On the contrary, when the test addresses matching the addresses of the first register 510 are stored in the second register 520 to output the repair enable signals PREN1, PREN2, and PREN256 at a low logic level and the test addresses mismatching the same are stored in the second register 520 to output the repair enable signals PREN1, PREN2, and PREN256 at a high logic level, the test host 112 may determine that the path of the repair enable signals PRENi (i=1 to 256) is a fail. The unit circuit including the path of the repair enable signals PRENi (i=1 to 256) determined to be a fail may be processed as dirty so as not to be used.

Referring to FIG. 9 in association with FIGS. 1 to 7, a test method S900 may perform a parallel test on the repair enable signals PREN1, PREN2, and PREN256. In stage S910, the first repair circuit 124(1) may store the repair addresses NR_ADDR in the first register 510 of each of the unit circuits 500(1) to 500(256). Preferably, the unit circuits 500(1) to 500(256) performing the stage S910 may include unit circuits that are not processed as dirty in the test method of FIG. 8. The repair addresses NR_ADDR may refer to faulty addresses detected during testing of the memory device 120. The test host 112 may detect faulty addresses by repeatedly performing a write operation and a read operation on the memory cell array 122.

For example, the test host 112 may first sequentially provide a first active command with a row address (e.g., 0x0000), a first write command with write data "0", and a precharge command to the memory device 120 for a write operation; may provide a second active command with a subsequent row address (e.g., 0x0001), a second write command with inverted write data "1", and a precharge command; and may provide a third active command with the previous row address (e.g., 0x0000), a read command, and a precharge command for a read operation. The precharge command may be configured such that a wordline activated by a previous command is not disabled. The test host 112 may detect faulty addresses by monitoring whether read data different from write data "0" is output. By performing a test on the addresses of all memory cell rows as described above, the faulty addresses may be detected. The test host 112 may provide the detected faulty addresses as repair addresses NR_ADDR of the counter circuit 310.

In stage S920, the same addresses as the repair addresses may be provided to the second register 520 of each of the 256 unit circuits 500(1) to 500(256) by the test host 112. The first repair circuit 124(1) may compare the bits of the repair addresses stored in the first and second registers 510 and 520 using the comparison circuit 330. In each of the 256 unit circuits 500(1) to 500 (256), when the bits of the repair addresses of the first register 510 match the bits of the repair addresses of the second register 520, all of the hit signals HIT[15:2] may be output at a high logic level, and the repair enable signals PRENi (i=1 to 256) of each of the unit circuits 500(1) to 500(256) may be output at a high logic level.

In stage S930, the first repair circuit 124(1) using the XOR logic circuit 710 may output the first bank repair enable signal PREN_BANK1 indicating that the logic levels of the repair enable signals PRENi (i=1 to 256) of each of the unit circuits 500(1) to 500(256) are all the same. When all of the repair enable signals PREN1, PREN2, and PREN256 are at the same high logic level, the first bank repair enable signal PREN_BANK1 at a low logic level may be output.

In stage S940, the test host 112 may determine pass or fail of the path of the first bank repair enable signal PREN_BANK1 based on the logic level of the first bank repair enable signal PREN_BANK1. When the first bank first bank repair enable signal PREN_BANK1 is output at a low logic level, the test host 112 may determine that the path of the first bank repair enable signal PREN_BANK1 is a pass. On the contrary, when the first bank repair enable signal PREN_BANK1 is output at a high logic level, the test host 112 may determine that the path of the first bank repair enable signal PREN_BANK1 is a fail. When it is determined that the path of the first bank repair enable signal PREN-_BANK1 is a fail, the test host 112 may process the memory device 120 as faulty.

Figure 10:
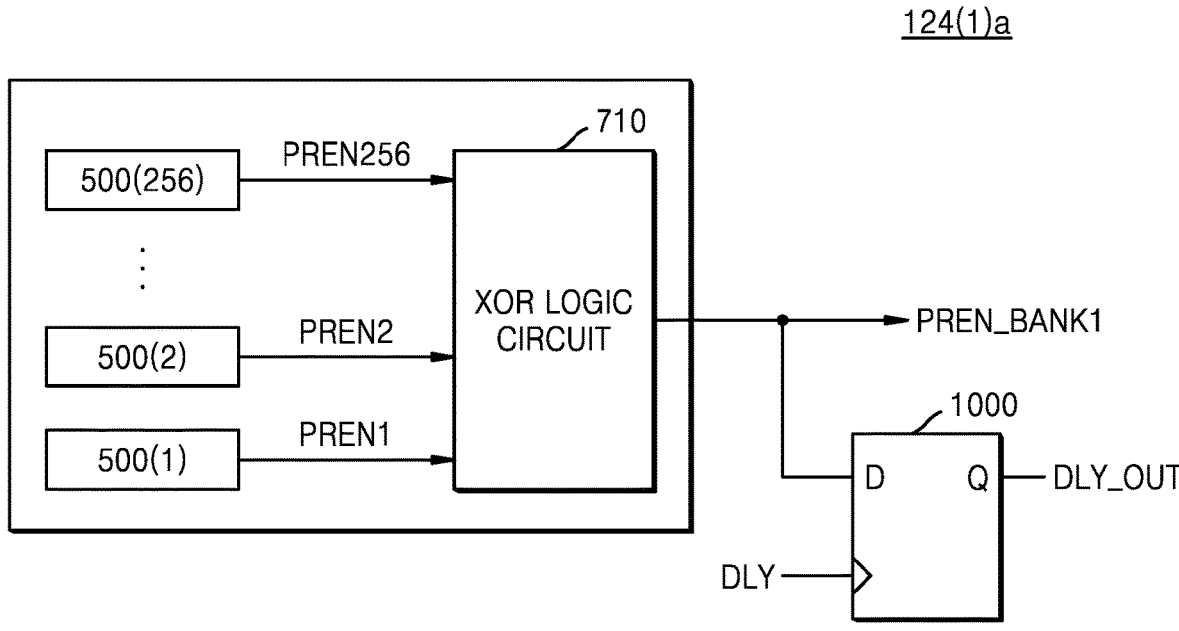
FIGS. 10, 11A, 11B, and 11C are diagrams illustrating a method of testing a repair circuit according to some embodiments.
Figure 11A:
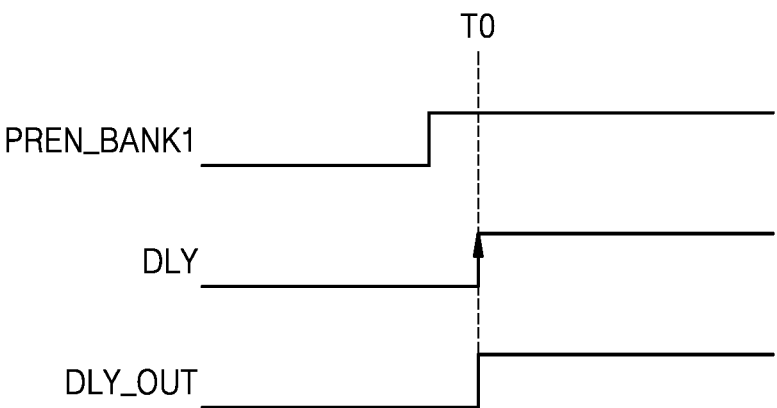
Figure 11B:
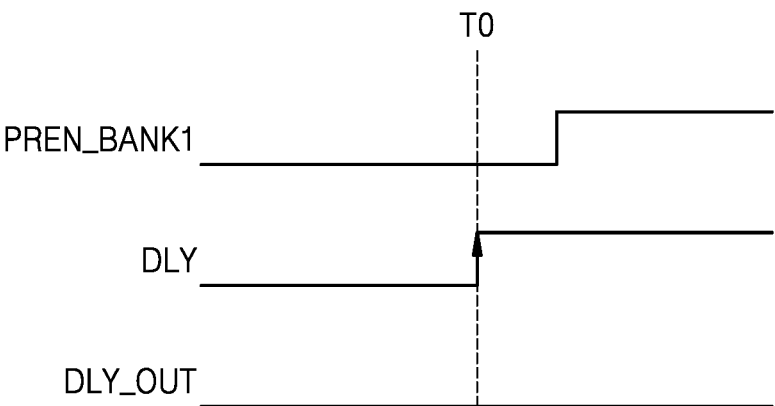
Figure 11C:
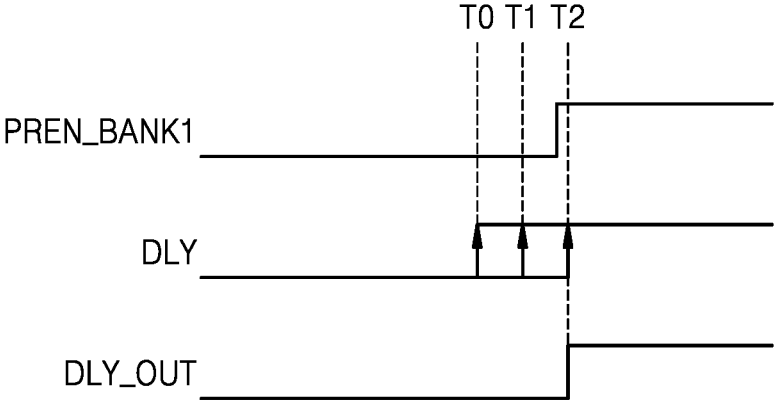

FIGS. 10-11C are diagrams illustrating a method of testing a repair circuit according to some embodiments. FIG. 10 is a block diagram of a first repair circuit 124(1)a, and FIGS. 11A to 11C are timing diagrams illustrating the operation of a first repair circuit 124(1)a of FIG. 10. In the timing diagrams described below, horizontal and vertical axes represent the time and the voltage level, respectively, and are not necessarily drawn to scale. In addition, a suffix (e.g., a in 124(1)a) attached to the same reference number in different drawings is to distinguish a plurality of circuits having similar or identical functions. For example, the first repair circuit 124(1)a of FIG. 10 is different from the first repair circuit 124(1) of FIG. 7 in that it further includes a flip-flop (F/F) circuit 1000. A description overlapping with that of the first repair circuit 124(1) is omitted.

Referring to FIG. 10, the F/F circuit 1000 of the first repair circuit 124(1)a may receive the first bank repair enable signal PREN_BANK1 as a data input. The F/F circuit 1000 may latch the first bank repair enable signal PREN-_BANK1 in response to a delay strobe signal DLY to output a delay output signal DLY_OUT. The delay strobe signal DLY may be provided from the test host 112 to monitor the delay level of the first bank repair enable signal PREN-_BANK1. The delay output signal DLY_OUT may be provided to the test host 112.

Referring to FIG. 11A, the test host 112 may set the addresses of the first and second registers 510 and 520 of the unit circuits 500(1), 500(2), and 500(256) to change the first bank repair enable signal PREN_BANK1 of the first repair circuit 124(1)a from a low logic level to a high logic level. For example, the test host 112 may output the first bank repair enable signal PREN_BANK1 at a low logic level by providing the same addresses to the first and second registers 510 and 520 of all of the unit circuits 500(1) to 500(256), and then may output the first bank repair enable signal PREN_BANK1 at a high logic level by providing different addresses to the first and second registers 510 and 520 of a certain unit circuit (e.g., 500(1)).

In FIG. 11A, the test host 112 may monitor the logic level of the delay output signal DLY_OUT by providing the delay strobe signal DLY at the time point T0. When the delay output signal DLY_OUT has a high logic level at the time point T0, the test host 112 may determine that the operation timing of the first repair circuit 124(1) a is stable. However, in FIG. 11B, when the delay output signal DLY_OUT has a low logic level at the time point T0, the test host 112 may determine that the operation of the first repair circuit 124(1) a is delayed. Accordingly, the test host 112 may monitor the logic level of the delay output signal DLY_OUT by providing the delay strobe signal DLY at each of the time points T1 and T2, as shown in FIG. 11C. In FIG. 11C, the delay output signal DLY_OUT at the time point T2 may be output at a high logic level. The test host 112 may determine that the delay operation of the first repair circuit 124(1)a is a fail based on the delay output signal DLY_OUT having a high logic level at the time point T2. When it is determined that the first repair circuit 124(1)a is a fail, the test host 112 may process the memory device 120 as faulty.

FIG. 12 is a circuit diagram of a repair circuit according to some embodiments.

Referring to FIG. 12, the repair circuit 124 may include the same second to fourth repair circuits 124(2) to 124(4) as the first repair circuit 124(1) described in FIG. 7. The repair circuit 124 may further include an XOR logic circuit 1200 that may receive first to fourth bank repair enable signals PREN_BANK1 to PREN_BANK4 output from the first to fourth repair circuits 124(2) to 124(4), respectively, and may output an all bank repair enable signal PREN_ALLBANK.

The repair circuit 124 may output the all bank repair enable signal PREN_ALLBANK at a low logic level when the logic levels of the first to fourth bank repair enable signals PREN_BANK1 to PREN_BANK4 are the same. When the addresses of the first and second registers 510 and 520 of the unit circuits 500(1), 500(2), and 500(256) in each of the first to fourth repair circuits 124(2) to 124(4) are set identically, all of the first to fourth bank repair enable signals PREN_BANK1 to PREN_BANK4 may be output at a low logic level, and the all bank repair enable signal PRE-N_ALLBANK may also be output at a low logic level.

The repair circuit 124 may output the all bank repair enable signal PREN_ALLBANK at a high logic level when any one of the first to fourth bank repair enable signals PREN_BANK1 to PREN_BANK4 has a different logic level. For example, the addresses of the first and second registers 510 and 520 of a certain unit circuit (e.g., 500(1)) of the first repair circuit 124(1) may be set differently, and the addresses of the first and second registers 510 and 520 of the remaining unit circuits 500(2) and 500(256) of the first repair circuit 124(1) and the addresses of the first and second registers 510 and 520 of the unit circuits 500(1), 500(2), and 500(256) of the second to fourth repair circuits 124(2) to 124(4) may be set identically. In this case, as the first bank repair enable signal PREN_BANK1 is output at a high logic level and the second to fourth bank repair enable signals PREN_BANK1 to PREN_BANK4 are output at a low logic level, the all bank repair enable signal PREN_ALLBANK may be output at a high logic level. It may be determined that the operation of the repair circuit 124 is good based on the all bank repair enable signal PREN_ALLBANK at a high logic level. However, when the all bank repair enable signal PREN_ALLBANK is output at a low logic level, it may be determined that the operation of the repair circuit 124 has failed. When it is determined that the repair circuit 124 is a fail, the test host 112 may process the memory device 120 as faulty.

Figure 13:
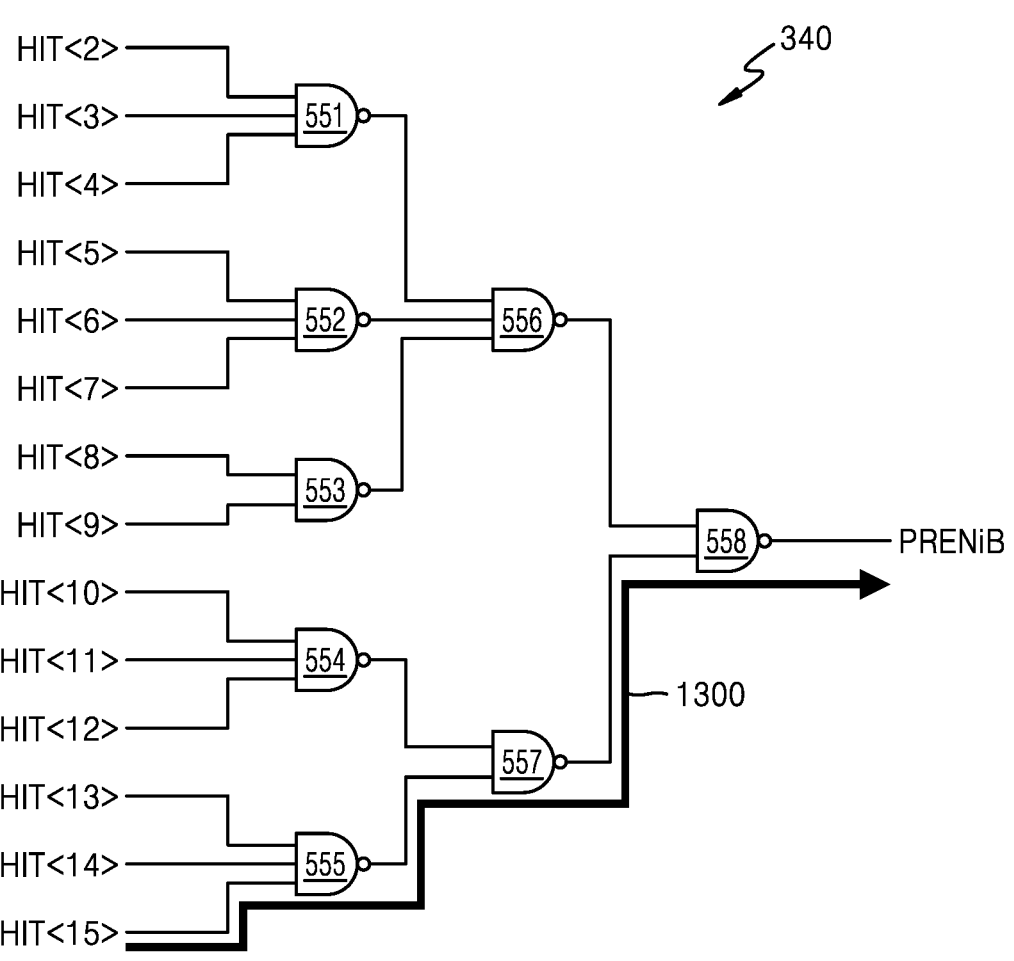
Figure 14:
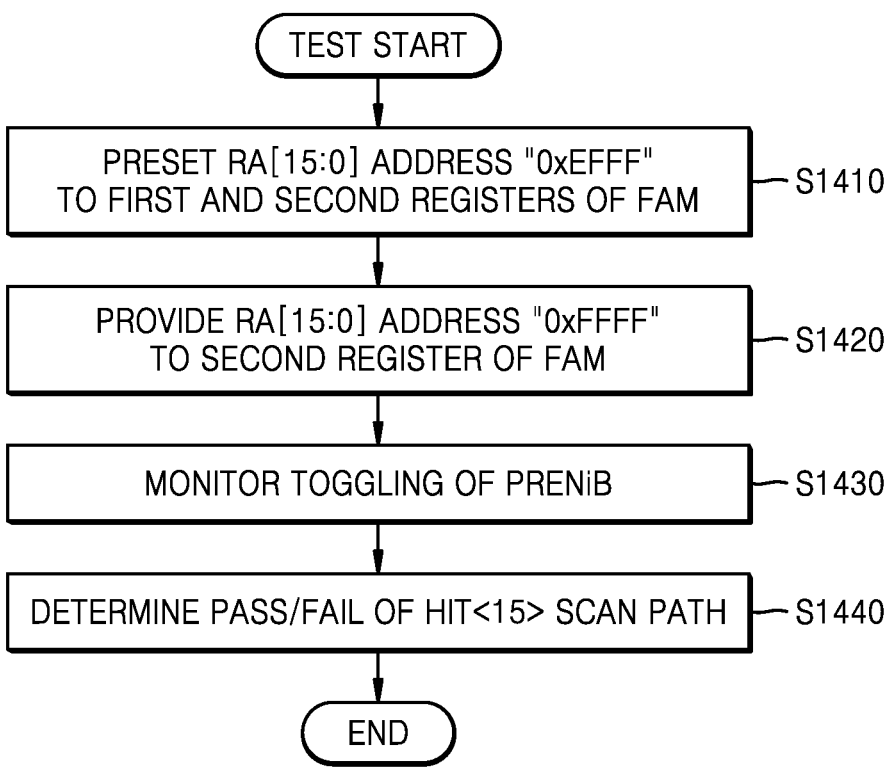

FIGS. 13 to 15 are diagrams illustrating a method of scan testing a repair circuit according to some embodiments. FIG. 13 illustrates a path carrying a particular hit signal (e.g., HIT<15>) within the combinational logic circuit 340 included in the unit circuit 500 of the repair circuit 124, FIG. 14 illustrates a method of scan testing the path of the hit signal HIT<15>, and FIG. 15 illustrates a pattern for testing the toggling of the pre-repair enable signals PRENiB.

Referring to FIGS. 5 and 13, when the bit values of the bits <15:2> of the addresses stored in the first and second registers 510 and 520 of the FAM 320 are matched, all of the hit signals HIT[15:2] output from the XNOR logic circuits 532 to 545 may be output at a high logic level. The combinational logic circuit 340 may output the pre-repair enable signals PRENiB at a low logic level when all of the hit signals HIT[15:2] are at a high logic level. Thereafter, the scan testing may be performed by changing the addresses of the second register 520 to output only a particular hit signal (e.g., HIT<15>) at a low logic level. The hit signal (e.g., HIT<15>) at a low logic level may be transferred to the pre-repair enable signals PRENiB line through a scan path 1300, and the path of the hit signal HIT<15> may be scan tested by monitoring the logic levels of the pre-repair enable signals PRENiB. Such scan testing may be performed to increase test efficiency and reduce test time.

Referring to FIG. 14, when the test host 112 equally presets the RA[15:0] address "0xEFFF" to the first and second registers 510 and 520 (stage S1410), the hit signals HIT[15:2] at a high logic level may be output and the pre-repair enable signals PRENiB at a low logic level may be output. Thereafter, the test host 112 may provide the RA[15:0] address "0xEFFF" to the second register 520 (stage S1420), and may expect that the hit signal HIT<15>, which is the output of the XOR logic circuit 545, is output at a low logic level and the pre-repair enable signal PRENiB is output at a high logic level. That is, the test host 112 may expect that, when the bit value of RA<15> address changes from "0" to "1", the logic level of the pre-repair enable signal PRENiB toggles from a low logic level to a high logic level. When the RA[15:0] address "0xEFFF" is provided to the second register 520 and the pre-repair enable signal PRENiB toggles from a low logic level to a high logic level (stage S1430), the test host 112 may determine that the operation of the scan path 1300 carrying the hit signal (e.g., HIT<15>) is good based on the toggling of the pre-repair enable signal PRENiB (stage S1440). However, when the pre-repair enable signal PRENiB does not toggle (stage S1430), the test host 112 may determine that the operation of the scan path 1300 carrying the hit signal (e.g., HIT<15>) has failed (stage S1440).

Referring to FIG. 15, the test host 112 may provide a hit signal HIT[15:0] pattern causing toggling of the pre-repair enable signals PRENiB of indices 1 to 8. The <15:2> bit value of the hit signal HIT[15:0] pattern may be provided to the hit signal HIT[15:2] line of FIG. 13. For example, when the hit signal HIT[15:0] pattern "0x0000" of index 1 is preset on the hit signal HIT[15:2] line, the pre-repair enable signal PRENiB at a low logic level may be output. Thereafter, when the hit signal HIT[15:0] pattern "0x0010" is provided to the hit signal HIT[15:2] line to test the toggling of the pre-repair enable signal PRENiB, the pre-repair enable signal PRENiB may toggle from a low logic level to a high logic level.

When the pre-repair enable signal PRENiB at a high logic level is output by presetting the hit signal HIT[15:0] pattern "0x0BFC" of index 2 to the hit signal HIT[15:2] line, the test host 112 may test whether the pre-repair enable signal PRENiB toggles from a high logic level to a low logic level by providing the hit signal HIT[15:0] pattern "0x0000" to the hit signal HIT[15:2] line.

When the pre-repair enable signal PRENiB at a low logic level is output by presetting the hit signal HIT[15:0] pattern "0x0000" of index 3 to the hit signal HIT[15:2] line, the test host 112 may test whether the pre-repair enable signal PRENiB toggles from a low logic level to a high logic level by providing the hit signal HIT[15:0] pattern "0x6600" to the hit signal HIT[15:2] line.

When the pre-repair enable signal PRENiB at a high logic level is output by presetting the hit signal HIT[15:0] pattern "0xFF24" of index 4 to the hit signal HIT[15:2] line, the test host 112 may test whether the pre-repair enable signal PRENiB toggles from a high logic level to a low logic level by providing the hit signal HIT[15:0] pattern "0x0000" to the hit signal HIT[15:2] line.

When the pre-repair enable signal PRENiB at a low logic level is output by presetting the hit signal HIT[15:0] pattern "0xFFFF" of index 5 to the hit signal HIT[15:2] line, the test host 112 may test whether the pre-repair enable signal PRENiB toggles from a low logic level to a high logic level by providing the hit signal HIT[15:0] pattern "0xFFEF" to the hit signal HIT[15:2] line.

When the pre-repair enable signal PRENiB at a high logic level is output by presetting the hit signal HIT[15:0] pattern "0x0A03" of index 6 to the hit signal HIT[15:2] line, the test host 112 may test whether the pre-repair enable signal PRENiB toggles from a high logic level to a low logic level by providing the hit signal HIT[15:0] pattern "0xFFFF" to the hit signal HIT[15:2] line.

When the pre-repair enable signal PRENiB at a low logic level is output by presetting the hit signal HIT[15:0] pattern "0xFFFF" of index 7 to the hit signal HIT[15:2] line, the test host 112 may test whether the pre-repair enable signal PRENiB toggles from a low logic level to a high logic level by providing the hit signal HIT[15:0] pattern "0x63EF" to the hit signal HIT[15:2] line.

When the pre-repair enable signal PRENiB at a high logic level is output by presetting the hit signal HIT[15:0] pattern "0x0127" of index 8 to the hit signal HIT[15:2] line, the test host 112 may test whether the pre-repair enable signal PRENiB toggles from a high logic level to a low logic level by providing the hit signal HIT[15:0] pattern "0xFFFF" to the hit signal HIT[15:2] line.

The test host 112 may determine that the operation of the repair circuit 124 is good based on the toggling of the pre-repair enable signals PRENiB by the hit signal HIT[15:0] pattern of indices 1 to 8, and may determine that the operation of the repair circuit 124 has failed when the pre-repair enable signals PRENiB do not toggle. When it is determined that the repair circuit 124 is a fail, the test host 112 may process the memory device 120 as faulty.

According to some embodiments, the test host 112 may test whether the pre-repair enable signals PRENiB are output at a low logic level by providing the same hit signal HIT[15:0] pattern, e.g., "0xFFFF" or "0xFFFF", to the hit signal HIT[15:2] line.

Figure 16:
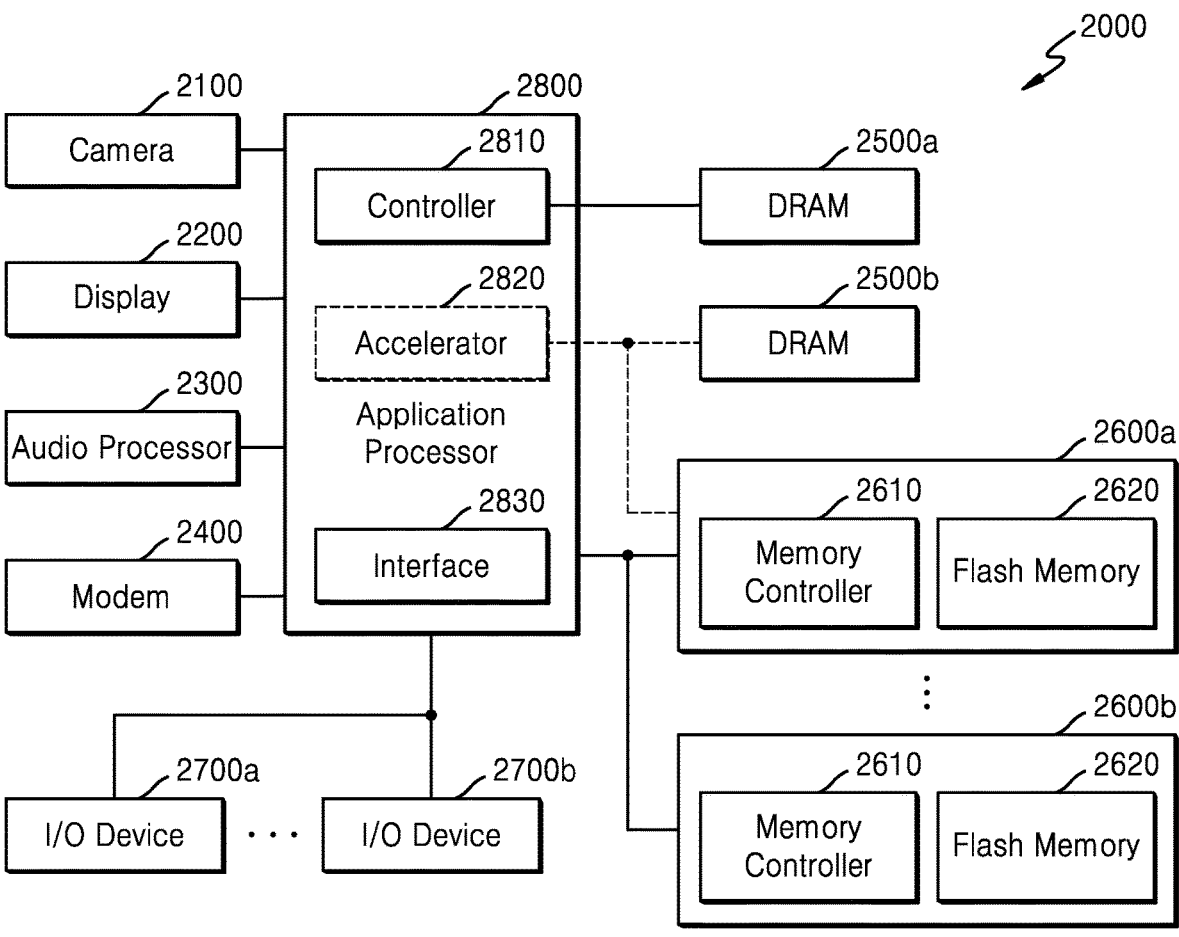
FIG. 16 is a block diagram of a system for illustrating an electronic device including a memory device according to some embodiments.

FIG. 16 is a block diagram of a system 2000 that includes an electronic device having a memory device according to some embodiments.

Referring to FIG. 16, the system 2000 may include a camera 2100, a display 2200, an audio processor 2300, a modem 2400, DRAMs 2500*a* and 2500*b*, flash memories 2600*a* and 2600*b*, I/O devices 2700*a* and 2700*b*, and an application processor (AP) 2800. As non-limiting examples, the system 2000 may be implemented as a laptop computer, a mobile phone, a smart phone, a tablet personal computer, a wearable device, a healthcare device, or an Internet of things (IoT). The system 2000 may also be implemented as a server or a personal computer.

The camera 2100 may capture still images or moving images under user control, and may store or transmit the captured image/video data e.g., to the display 2200. The audio processor 2300 may process audio data included in content of the flash memories 2600*a* and 2600*b* and/or a data network (not shown) accessed via the modem 2400. The modem 2400 may modulate and transmit a signal as part of transmission of wired/wireless data, and may demodulate a received signal and restore data therein as part of reception of wired/wireless data. The I/O devices 2700*a* and 2700*b* may include devices providing digital input and/or output capabilities, such as universal serial bus (USB) or storage, a digital camera, a secure digital (SD) card, a digital versatile disc (DVD), a network adapter, a touch screen, or the like.

The AP 2800 may control overall operations of the system 2000. The AP 2800 may include a control block 2810, an accelerator block or an accelerator chip 2820, and an interface block 2830. The AP 2800 may control the display 2200 to display some of the content stored in the flash memories 2600*a* and 2600*b* on the display 2200. When a user input is received through the I/O devices 2700*a* and 2700*b*, the AP 2800 may perform a control operation corresponding to the user input. The AP 2800 may include an accelerator block, which may be a dedicated circuit for artificial intelligence (AI) data operation, or may include an accelerator chip 2820 that is separate from the AP 2800. In some embodiments, the DRAM 2500*b* may be mounted on the accelerator block or the accelerator chip 2820. The accelerator, which may be a functional block that is specialized in particular functions of the AP (2800), may include a graphics processing unit (GPU) that is a functional block specialized in graphics data processing, a neural processing unit (NPU) that is a block specialized in AI calculation and inference, and/or a data processing unit (DPU) that is a block specialized in data transmission.

The system 2000 may include the plurality of DRAMs 2500*a* and 2500*b*. The AP 2800 may control the DRAMs 2500*a* and 2500*b* by setting commands and MRS that conform to the joint electron device engineering council (JEDEC) standard, and/or may communicate by setting DRAM interface protocols to use company-specific functions, such as low voltage/high speed/reliability and cyclic redundancy check (CRC)/error correction code (ECC) functions. For example, the AP 2800 may communicate with the DRAM 2500*a* through an interface that meets JEDEC standard such as LPDDR4 and LPDDR5, and the accelerator block or the accelerator chip 2820 may communicate by setting new DRAM interface protocols to control the accelerator DRAM 2500*b*, which may have a higher bandwidth than the DRAM 2500*a*.

FIG. 16 illustrates only the DRAMs 2500*a* and 2500*b*, but the present disclosure is not limited thereto, and any memory such as PRAM, static RAM (SRAM), MRAM, RRAM, ferroelectric RAM (FRAM), or hybrid RAM may be used as long as the bandwidth, response speed, and/or voltage conditions of the AP 2800 or the accelerator chip 2820 are satisfied. The DRAMs 2500*a* and 2500*b* may have relatively smaller latency and bandwidth than the I/O devices 2700*a* and 2700*b* or the flash memories 2600*a* and 2600*b*. The DRAMs 2500*a* and 2500*b* may be initialized when the system 2000 is powered on, and may be used as temporary storage places for the operating system and application data which may be loaded into the DRAMs 2500*a* and 2500*b*, and/or as execution spaces for various software codes.

In the DRAMs 2500*a* and 2500*b*, addition, subtraction, multiplication, and division operations, vector operations, address operations, or fast Fourier transform (FFT) operations may be performed. In addition, operations of a function for execution used for inference may be performed within the DRAMs 2500*a* and 2500*b*. The inference may be performed in a deep learning algorithm using an artificial neural network. The deep learning algorithm may include a training stage of learning a model through various data and an inference stage of recognizing data with the learned model. In some embodiments, images captured by a user through the camera 2100 may be signal-processed and stored in the DRAM 2500*b*, and the accelerator block or the accelerator chip 2820 may perform an AI data operation for recognizing data using the data stored in the DRAM 2500*b* and the function used for inference.

The system 2000 may include a plurality of storages or a plurality of flash memories 2600*a* and 2600*b* having a relatively larger capacity than the DRAMs 2500*a* and 2500*b*. The accelerator block or the accelerator chip 2820 may perform the training stage and the AI data operation using the flash memories 2600*a* and 2600*b*. In some embodiments, the flash memories 2600*a* and 2600*b* may each include a memory controller 2610 and a flash memory device 2620, and may perform more efficiently the inference AI data operation and the training stage performed by the AP 2800 and/or the accelerator chip 2820, for example using an arithmetic unit provided in the memory controller 2610. The flash memories 2600*a* and 2600*b* may store photos taken through the camera 2100 or data transmitted through the data network. For example, augmented reality/virtual reality, high definition (HD), or ultra-high definition (UHD) content may be stored.

In the system 2000, the DRAMs 2500*a* and 2500*b* may perform the method of testing the repair circuit described with reference to FIGS. 1 to 15. The method of testing the repair circuit may output the hit signals by comparing the bit values of the first addresses stored in the first register of the repair circuit with the bit values of the test addresses stored in the second register of the repair circuit, output the repair enable signals based on the hit signals, and determine pass or fail of the path where the repair enable signals are generated based on the logic levels of the repair enable signals. The test host may individually test each address bit by sequentially providing addresses of memory cell rows of each of the memory banks as the test addresses. The test host may test the address bits in parallel by providing the same test addresses as the first addresses. The test host may perform a scan test on a path where the repair enable signals are generated by providing addresses configured to cause the repair enable signals to toggle as the test addresses. The test host may determine pass or fail of the path where the repair enable signals are generated by providing a hit signal pattern that causes the repair enable signals to toggle to the lines carrying the hit signals. The test host may monitor the delay of the repair enable signals by changing the application timing of the delay strobe signal. According to the method of testing the repair circuit, yield and reliability may be improved by detecting faults in the repair circuit, determining that it is not possible to repair the repair circuit, and processing the repair circuit as faulty, thereby stopping subsequent processes and/or tests to secure the good quality thereof. In addition, when testing a repair circuit, a particular circuit path may be selectively tested to increase test efficiency and reduce test time.

While the inventive concepts have been particularly shown and described with reference to some examples of embodiments thereof, it will be understood that various changes in form and details may be made therein without departing from the scope of the following claims.

What is claimed is:

1. A method of testing a repair circuit of a memory device, the method comprising:

storing first addresses in a first register of the repair circuit, wherein the first register is configured to store faulty addresses during a normal operation of the memory device, and wherein the repair circuit is configured to perform a repair operation to replace the faulty addresses with redundancy addresses;

storing test addresses in a second register of the repair circuit, wherein the test addresses are provided from a test host;

outputting hit signals by comparing bit values of the first addresses stored in the first register with bit values of the test addresses stored in the second register;

outputting repair enable signals based on the hit signals; and determining a status of a path where the repair enable signals are generated based on logic levels of the repair enable signals, wherein the determining the status of the path where the repair enable signals are generated based on the logic levels of the repair enable signals comprises:

determining the status of the path as a fail when the first addresses match the test addresses and the repair enable signals have a first logic level; or determining the status of the path as a fail when the first addresses do not match the test addresses and the repair enable signals have a second logic level that is different than the first logic level.

2. The method of claim 1, further comprising providing the first addresses based on addresses provided from a test mode register set of the memory device.

3. The method of claim 1, wherein the storing of the test addresses in the second register of the repair circuit comprises sequentially providing, by the test host and as the test addresses, addresses of memory cell rows of each of memory banks included in a memory cell array.

4. The method of claim 3, wherein the outputting of the hit signals by comparing the bit values of the first addresses stored in the first register with the bit values of the test addresses stored in the second register comprises outputting the hit signals using XNOR logic circuits that each receive corresponding bit values of the addresses of the first and second registers.

5. The method of claim 4, wherein the determining the status of the path where the repair enable signals are generated based on the logic levels of the repair enable signals comprises:

determining the status of the path as a pass when the first addresses match the test addresses and the repair enable signals have the second logic level; or determining the status of the path as a pass when the first addresses do not match the test addresses and the repair enable signals have the first logic level that is different than the second logic level.

6. The method of claim 1, wherein the storing of the test addresses in the second register of the repair circuit comprises providing, by the test host, addresses that are identical to the first addresses as the test addresses.

7. The method of claim 6, wherein the outputting of the hit signals by comparing the bit values of the addresses stored in the first register with the bit values of the addresses stored in the second register comprises outputting the hit signals using XNOR logic circuits that each receive corresponding bit values of the addresses of the first and second registers.

8. The method of claim 7, wherein the determining a status of the path where the repair enable signals are generated based on the logic levels of the repair enable signals comprises:

determining the status of the path as a pass when the repair enable signals have the second logic level; or determining the status of the path as a fail when the repair enable signals have the first logic level.

9. The method of claim 1, further comprising monitoring logic levels of the repair enable signals in response to a delay strobe signal applied from the test host.

10. The method of claim 9, wherein the monitoring of the logic levels of the repair enable signals in response to the delay strobe signal applied from the test host comprises changing an application time of the delay strobe signal.

11. A method of testing a repair circuit of a memory device, the method comprising:

presetting first addresses to a first register and a second register of the repair circuit, wherein the first register is configured to store faulty addresses during a normal operation of the memory device, and the repair circuit is configured to perform a repair operation to replace the faulty addresses with redundancy addresses;

providing test addresses to the second register, wherein the test addresses are provided from a test host and are addresses configured to cause repair enable signals output from the repair circuit to toggle;

outputting hit signals by comparing bit values of the first addresses stored in the first register with bit values of the test addresses stored in the second register;

outputting the repair enable signals based on the hit signals;

providing, by the test host, a hit signal pattern causing toggling of the repair enable signals to lines carrying the hit signals, and determining a status of a path where the repair enable signals are generated based on the toggling of the repair enable signals.

12. A memory device comprising:

a memory cell array including memory banks, wherein each of the memory banks includes a plurality of memory cells arranged at intersections of a plurality of rows and a plurality of columns, and redundancy memory cells for repairing faulty memory cells among the plurality of memory cells; and for each of the memory banks, a repair circuit configured to include a plurality of unit circuits configured to generate repair enable signals that instruct a repair operation on the faulty memory cells, wherein the unit circuits of the repair circuit comprise:

fail address memory including a first register and a second register, the first register configured to store first addresses and the second register configured to store test addresses, wherein the test addresses are provided from a test host;

a comparison circuit configured to output hit signals by comparing bit values of the first addresses stored in the first register with bit values of the test addresses stored the second register; and a combinational logic circuit configured to output the repair enable signals based on the hit signals, wherein a status of a path where the repair enable signals are generated is determined based on logic levels of the repair enable signals, and wherein the determining the status of the path where the repair enable signals are generated based on the logic levels of the repair enable signals comprises:

determining the status of the path as a fail when the first addresses match the test addresses and the repair enable signals have a first logic level; or determining the status of the path as a fail when the first addresses do not match the test addresses and the repair enable signals have a second logic level that is different than the first logic level.

13. The memory device of claim 12, wherein the repair circuit further comprises a counter circuit configured to output count addresses by sequentially incrementing addresses provided from a test mode register set of the memory device, and respectively provides, as the first addresses, the count addresses output from the counter circuit to the plurality of unit circuits of the repair circuit.

14. The memory device of claim 12, wherein addresses of memory cell rows of each of the memory banks are sequentially provided to the test addresses.

15. The memory device of claim 12, wherein the test addresses are same as the first addresses.

16. The memory device of claim 12, wherein the test addresses are addresses configured to cause the repair enable signals to toggle.

17. The memory device of claim 12, wherein, for each of the memory banks, the repair circuit includes a first XOR logic circuit configured to receive the repair enable signal output from each of the plurality of unit circuits and output bank repair enable signals of the corresponding memory bank; and a second XOR logic circuit configured to input the bank repair enable signals of each of the memory banks and output an all bank repair enable signal.

18. The memory device of claim 17, wherein the repair circuit further comprises a flip-flop (F/F) circuit configured to receive the bank repair enable signals, wherein the F/F circuit is configured to output a delay output signal by latching the bank repair enable signals in response to a delay strobe signal applied from the test host, and wherein the delay output signal is provided to the test host.

* * * * *